(12) United States Patent
Inoue

(10) Patent No.: US 8,476,825 B2
(45) Date of Patent: Jul. 2, 2013

(54) ORGANIC ELECTROLUMINESCENT LIGHT SOURCE DEVICE

(75) Inventor: Hiroyasu Inoue, Tokyo (JP)

(73) Assignee: Zeon Corporation, Tokyo (JP)

( * ) Notice: Subject to any disclaimer, the term of this patent is extended or adjusted under 35 U.S.C. 154(b) by 0 days.

(21) Appl. No.: 13/502,024

(22) PCT Filed: Oct. 13, 2010

(86) PCT No.: PCT/JP2010/067958
§ 371 (c)(1),
(2), (4) Date: Apr. 13, 2012

(87) PCT Pub. No.: WO2011/046144
PCT Pub. Date: Apr. 21, 2011

(65) Prior Publication Data
US 2012/0200221 A1   Aug. 9, 2012

(30) Foreign Application Priority Data

Oct. 14, 2009   (JP) ................. 2009-237169

(51) Int. Cl.
*H01L 51/52* (2006.01)

(52) U.S. Cl.
USPC .......................... 313/504; 313/110

(58) Field of Classification Search
USPC ................................ 313/498–512
See application file for complete search history.

(56) References Cited

U.S. PATENT DOCUMENTS

| | | |
|---|---|---|
| 2004/0012980 A1 | 1/2004 | Sugiura et al. |
| 2004/0195962 A1 | 10/2004 | Nakamura et al. |
| 2004/0211971 A1 | 10/2004 | Takei et al. |
| 2005/0161693 A1 | 7/2005 | Sugiura et al. |
| 2005/0269947 A1 | 12/2005 | Kobayashi |
| 2006/0108580 A1 | 5/2006 | Yoshida et al. |
| 2009/0021137 A1 | 1/2009 | Sugiura et al. |
| 2009/0097234 A1 | 4/2009 | von Malm |

FOREIGN PATENT DOCUMENTS

| | | |
|---|---|---|
| JP | 2003-36969 A | 2/2003 |
| JP | 2003-332067 A | 11/2003 |
| JP | 2004-119147 A | 4/2004 |
| JP | 2004-296423 A | 10/2004 |
| JP | 2006-347072 A | 12/2005 |
| JP | 2006-92936 A | 4/2006 |
| JP | 2007-207529 A | 8/2007 |
| JP | 2008-163243 A | 7/2008 |
| JP | 2009-87938 A | 4/2009 |

OTHER PUBLICATIONS

International Search Report for PCT/JP2010/067958 dated Jan. 18, 2011.

*Primary Examiner* — Donald Raleigh
(74) *Attorney, Agent, or Firm* — Birch, Stewart, Kolasch & Birch, LLP

(57) ABSTRACT

An organic electroluminescent light source device including a first transparent electrode layer, a light-emitting layer, a second transparent electrode layer, and a reflective layer having a reflective surface, in this order from a light-emitting surface side, and further including a structural layer X that is provided between the second transparent electrode layer and the reflective surface and is in contact with the reflective surface, wherein the reflective surface has a concavo-convex structure, the concavo-convex structure has a plurality of concavo-convex structure units formed of depressions or protrusions, and a refractive index n of the structural layer X, an inclination angle $\theta \times 1$ (°) of the concavo-convex structure units, and a mean inclination angle $\theta \times 2$ (°) of the concavo-convex structure at the reflective surface satisfy $\theta \times 1 \leq \sin^{-1}(1/n)$ and $\{90 - \sin^{-1}(1/n)\}/3 \leq \theta \times 2 \leq \sin^{-1}(1/n)$.

7 Claims, 10 Drawing Sheets

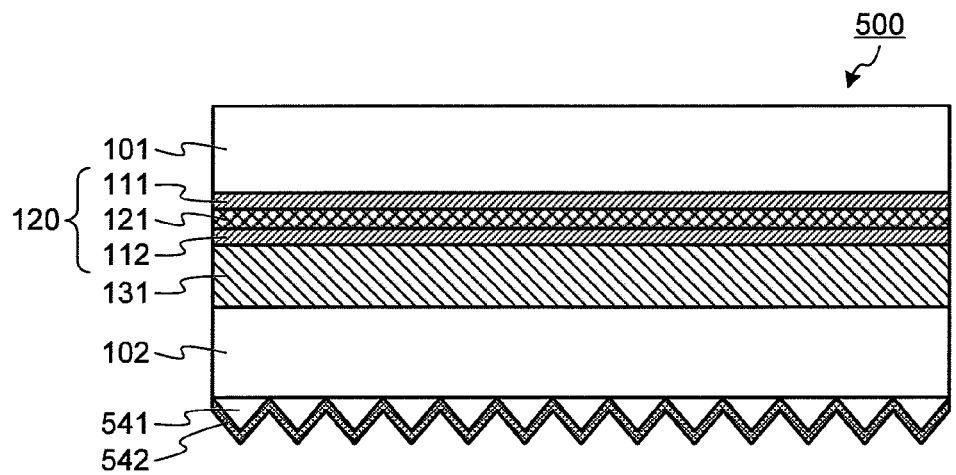
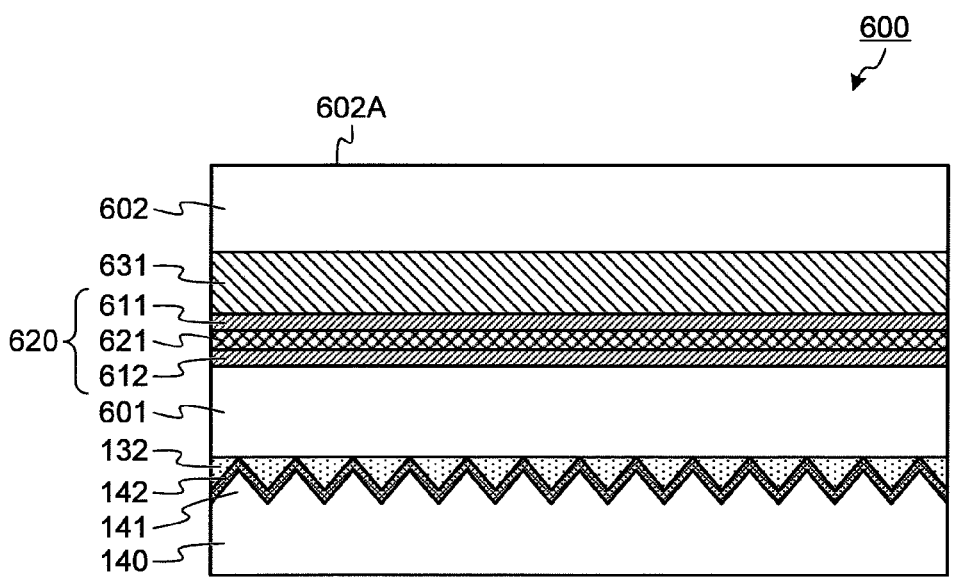

ORGANIC ELECTROLUMINESCENT LIGHT SOURCE DEVICE

FIELD

The present invention relates to an organic electroluminescent (hereinafter sometimes referred to as "organic EL") light source device.

BACKGROUND

An organic EL light source device is an element in which an organic light-emitting layer is provided between a plurality of electrode layers to electrically obtain light emission. Organic EL light source devices have been studied regarding its use as a display element in place of a liquid crystal cell. Further, the use of organic EL light source devices as a surface light source, such as a backlight for flat-type illumination or for a liquid crystal display device, that utilizes the characteristics of a high luminous efficiency, low voltage drive, light weight, low cost and the like, is also being studied.

One issue when using an organic EL light source device as a surface light source is how to efficiently extract light in a useful form from the organic EL light source device. For example, although the light-emitting layer of the organic EL light source device itself has a high luminous efficiency, the light amount decays due to interference and the like in the layers during the light passes through the layered structures of the device and emitted therefrom. Thus, this loss of light needs to be as small as possible.

As a method for increasing light extraction efficiency, for example, Patent Literature 1 discloses improvement of the overall brightness by suppressing the brightness in the frontal direction(0°) of the device and increasing the brightness at angles of 50 to 70°.

CITATION LIST

Patent Literature

Patent Literature 1: Japanese Patent Application Laid-Open No. 2004-296423

SUMMARY

Technical Problem

However, there is a need for further improvement in light extraction efficiency of a light source device.

Therefore, it is an object of the present invention to provide an organic EL light source device that has a higher light extraction efficiency.

Solution to Problem

As a result of research by the present inventor to solve the aforementioned problem, the present inventor has found out that the aforementioned problem could be resolved by, in an organic EL light source device, using transparent electrodes for both of a pair of electrodes forming a light-emitting element, providing a reflective layer having a reflective surface that has a concavo-convex structure, and setting a relationship between the inclination angle of this concavo-convex structure and the refractive index of a structural layer provided in contact with the reflective surface to satisfy a specific expression, thereby completing the present invention.

Accordingly, the present invention provides the following [1] to [7].

[1] An organic electroluminescent light source device comprising a first transparent electrode layer, a light-emitting layer, a second transparent electrode layer, and a reflective layer having a reflective surface, in this order from a light-emitting surface side, and further comprising a structural layer X that is provided between the second transparent electrode layer and the reflective surface and is in contact with the reflective surface, wherein the reflective surface has a concavo-convex structure, the concavo-convex structure has a plurality of concavo-convex structure units formed of depressions or protrusions, and a refractive index n of the structural layer X, an inclination angle $\theta \times 1$ (°) of the concavo-convex structure units, and a mean inclination angle $\theta \times 2$ (°) of the concavo-convex structure at the reflective surface satisfy the following expressions (1) and (2):

$$\theta \times 1 \leq \sin^{-1}(1/n) \qquad (1)$$

$$\{90 - \sin^{-1}(1/n)\}/3 \leq \theta \times 2 \leq \sin^{-1}(1/n) \qquad (2).$$

[2] The organic electroluminescent light source device according to [1], wherein the refractive index n of the structural layer X and the mean inclination angle $\theta \times 2$(°) of the concavo-convex structure at the reflective surface satisfy the following expression (3):

$$\{90 - \sin^{-1}(1/n)\}/2 \leq \theta \times 2 \leq \sin^{-1}(1/n) \qquad (3)$$

[3] The organic electroluminescent light source device according to [1] or [2], wherein the refractive index n of the structural layer X and the mean inclination angle $\theta \times 2$ (°) of the concavo-convex structure at the reflective surface satisfy the following expression (4):

$$(\{90 + \sin^{-1}(1/n)\}/4) - 5 \leq \theta \times 2 \leq (\{90 + \sin^{-1}(1/n)\}/4) + 5 \qquad (4).$$

[4] The organic electroluminescent light source device according to any one of [1] to [3], wherein the concavo-convex structure units of the reflective surface have a pyramid or prismoid shape.

[5] The organic electroluminescent light source device according to any one of [1] to [4], wherein the concavo-convex structure has depressions provided apart from each other as concavo-convex structure units and flat gap portions between adjacent depressions.

[6] The organic electroluminescent light source device according to any one of [1] to [5], wherein the reflective layer is a stacked body of a first metal layer including a first metal and a second metal layer including a second metal which is different from the first metal.

[7] The organic electroluminescent light source device according to any one of [1] to [6], further comprising a light diffusion layer provided on a light-emitting surface side of the reflective layer.

Advantageous Effects of the Invention

The light source device according to the present invention has a high light extraction efficiency while also being highly durable even when having a simple, thin structure. Therefore, the light source device of the invention is useful as the light source for a backlight for use in a liquid crystal display device, an illumination device and the like.

BRIEF DESCRIPTION OF DRAWINGS

FIG. 5 is an elevated cross-sectional view schematically illustrating a layer configuration of an organic EL light source device according to a third embodiment of the present invention.

FIG. 6 is an elevated cross-sectional view schematically illustrating a layer configuration of an organic EL light source device according to a fourth embodiment of the present invention.

DESCRIPTION OF EMBODIMENTS

Figure 1:
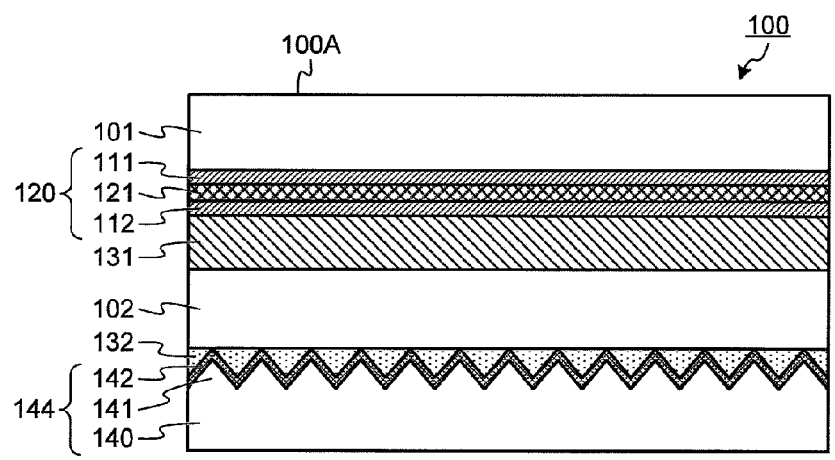
FIG. 1 is an elevated cross-sectional view schematically illustrating a layer configuration of an organic EL light source device according to a first embodiment of the present invention.

Preferred embodiments of the present invention will now be described with reference to the drawings. In each drawing, the shape, size, and arrangement of the components are illustrated merely in a schematic manner that allows understanding of the present invention. The present invention is not limited to the following description. Further, the respective components may be appropriately changed within the scope of the claims and equivalent thereto. In the drawings used in the following description, components that are the same are denoted with the same reference numerals, and repetitive descriptions may be omitted.

(First Embodiment)

FIG. 1 is an elevated cross-sectional view schematically illustrating a layer configuration of an organic EL light source device according to a first embodiment of the present invention. Unless otherwise specified, in the present application the light source device will be described assuming that its light-emitting layer is horizontally placed with the light-emitting surface of the device facing upwards. Therefore, unless otherwise specified, in the following description the expression "horizontal plane" is the plane that is parallel to the main plane of the light-emitting layer, the upper side of the light source device is the light-emitting surface side, and the lower side is the side opposite to the light-emitting surface. This is simply for the sake of convenient explanation of the positional relationships. The placement of the light source device when the light source device is used is not at all limited to this horizontal placement state.

Further, in the following description, the light incident angle, the light emission angle, the light reflection angle, and the critical angle of light at an interface are the angles between the incident light, emitting light, or reflected light and the normal direction of the interface. In addition, in the following description, the inclination angle of the concavo-convex structure is the angle between a surface of the concavo-convex structure and the horizontal plane. The normal direction with respect to the horizontal plane is sometimes simply referred to as the "Z axis direction".

In FIG. 1, a device 100 includes a substrate 101, a light-emitting element 120 that is provided on a lower side of the substrate 101, a sealing substrate 102 that is provided on a lower side of the light-emitting element 120 with a sealing layer 131 arranged therebetween, and a reflective portion composite body 144 that is provided on a lower side of the sealing substrate 102 with an adhesion layer 132 arranged therebetween. The sealing layer 131, the sealing substrate 102, and the substrate 101 seal the light-emitting element 120. Consequently, degradation of the light-emitting element 120 due to contact with oxygen, moisture and the like in the exterior air when the light source device 100 is used can be prevented.

The reflective portion composite body 144 includes a reflective portion composite substrate 140 with a concavo-convex structure portion 141 formed thereon, and a reflective layer 142 that is provided on the concavo-convex structure portion 141. The reflective layer 142 is adhered to the lower surface of the sealing substrate 102 via the adhesion layer 132. In the first embodiment, the upper surface of the reflective layer 142 serves as the reflective surface. The reflective surface has a plurality of concavo-convex structure units. The concavo-convex structure unit consists of a depression or a protrusion. The reflective layer 142 is provided along the surface of the concavo-convex structure portion 141.

(Substrate and Sealing Substrate)

Examples of substrates that may be employed for the substrate 101 and the sealing substrate 102 may include substrates that may be generally used as an organic EL light-emitting element substrate, such as a glass substrate, quartz substrate, and plastic substrate. The material forming the substrate 101 may be the same as or different from that forming the sealing substrate 102. The thickness of each of the substrate and sealing substrate may be 0.01 to 5 mm.

(Light-Emitting Element)

In the present embodiment, the light-emitting element 120 includes a first transparent electrode layer 111, a light-emitting layer 121, and a second transparent electrode layer 112, in this order from the light-emitting side.

The light-emitting layer 121 is not particularly limited, and a known light-emitting layer may be appropriately selected therefor. For adaptation to its use as a light source, the light-emitting layer may be a single type of layer or a combination of a plurality of types of layers which is capable of emitting light that includes the below-described specific peak wavelength.

The first transparent electrode layer 111 is positioned closer to the light-emitting surface than the light-emitting layer 121, and the second transparent electrode layer 112 is positioned closer to the reflective layer than the light-emitting layer 121. The materials forming the respective transparent electrode layers 111 and 112 are not limited to particular materials, and may be appropriately selected from among known materials that are used for an organic EL light-emitting element electrode. Either the first transparent electrode layer 111 or the second transparent electrode layer 112 is made to serve as the anode, while the other is made to serve as the cathode. In addition to the light-emitting layer, other layers may be provided between the electrodes, such as a hole injection layer, a hole transport layer, an electron transport layer, an electron injection layer, and a gas barrier layer.

Examples of the material for the first transparent electrode layer 111 and the second transparent electrode layer 112 may include a thin metal layer, ITO, IZO, and $SnO_2$.

Specific examples of the layer configuration of the light-emitting layer may include: a configuration of anode/hole transport layer/light-emitting layer/cathode; a configuration of anode/hole transport layer/light-emitting layer/electron injection layer/cathode; a configuration of anode/hole injection layer/light-emitting layer/cathode; a configuration of anode/hole injection layer/hole transport layer/light-emitting layer/electron transport layer/electron injection layer /cathode; a configuration of anode/hole transport layer /light-emitting layer/electron injection layer/equipotential surface forming layer/hole transport layer /light-emitting layer/electron injection layer/cathode; and a configuration of anode/hole transport layer/light-emitting layer/electron injection layer/charge generation layer/hole transport layer/light-emitting layer/electron injection layer/cathode. The light-emitting element in the organic EL light source device of the present invention may have one or more light-emitting layers between the anode and the cathode. Further, the light-emitting layer may have a stacked body of layers having a plurality of different emission colors, or a mixed layer that is a certain pigment layer which is doped with a different pigment. The materials for these layers are not particularly limited. Examples of the material forming the light-emitting layer may include polyparaphenylenevinylene-based materials, polyfluorene-based materials, and polyvinylcarbazole-based materials. Examples of the material forming the hole injection layer and the hole transport layer may include phthalocyanine-based materials, arylamine-based materials, and polythiophene-based materials. Examples of the material forming the electron injection layer and the electron transport layer may include aluminum complexes and lithium fluoride. Examples of the equipotential surface forming layer and the charge generation layer may include a transparent electrode formed from ITO, IZO, $SnO_2$ and the like, and a thin metal layer of Ag, Al and the like.

The first transparent electrode layer 111, the light-emitting layer 121, the second transparent electrode layer 112, and other optional layers forming the light-emitting element 120 may be provided on the substrate 101 by successively stacking these layers. The thickness of each layer may be 10 to 1,000 nm.

(Sealing Layer)

Examples of materials that may be used to form the sealing layer 131 may include resins that have a function of causing adhesion of the second transparent electrode layer 112 and the sealing substrate 102, and that can prevent degradation of the light-emitting element 120 due to contact with moisture, oxygen and the like in the air when the device is used. The material forming the sealing layer 131 does not have to be a solid. For example, an inactive liquid such as a fluorohydrocarbon, silicon oil and the like, or a liquid crystal material of nematic liquid crystals, smectic liquid crystals and the like may be used.

Examples of materials that may be used for forming the sealing layer 131 may include an energy beam curable resin such as an acrylate resin, a methacrylate resin and the like, sticky-bonding function resins and adhesive-bonding function resins of an acrylic type, an olefinic type and the like, and a thermofusion type adhesive-bonding function resin that melts when heated and hardens when cooled. The "sticky-bonding function resin" herein may be a material that has a shear storage elastic modulus at a temperature of 23° C. of 0.1 to 10 MPa, and the "adhesive-bonding function resin" may be a material having a higher shear storage elastic modulus than that of the previous resin.

Examples of thermofusion type adhesive-bonding function resins for use that melt when heated and harden when cooled may include resins having a glass transition temperature (Tg) of usually −50 to 200° C., preferably −10 to 100° C., more preferably 20 to 90° C., and particularly preferably 50 to 80° C. By setting the glass transition temperature in the aforementioned preferred range, a light source device having sufficient heat resistance can be obtained, and adhesion can be effected without damaging the light-emitting layer constituting the light source device.

As the sticky-bonding function resin or adhesive-bonding function resin, a conjugated diene polymer cyclized product obtained by cyclizing a conjugated diene polymer may be used, in which the decrease ratio in unsaturated bonds present in the conjugated diene polymer cyclized product based on the unsaturated bonds in the conjugated diene polymer (unsaturated bond decrease ratio) is 30% or more. Further, as the sticky-bonding function resin or adhesive-bonding function resin, a composition containing a conjugated diene polymer cyclized product and an alicyclic olefin resin may also be used.

The conjugated diene polymer cyclized product may be obtained by cyclizing a conjugated diene polymer in the presence of an acid catalyst. As the conjugated diene polymer, a homopolymer and copolymer of conjugated diene monomers, as well as a copolymer of a conjugated diene monomer and other monomers may be used.

The conjugated diene monomer is not particularly limited. Specific examples thereof may include 1,3-butadiene, isoprene, 2,3-dimethyl-1,3-butadiene, 2-phenyl-1,3-butadiene, 1,3-pentadiene, 2-methyl-1,3-pentadiene, 1,3-hexadiene, 4,5-diethyl-1,3-octadiene, and 3-butyl-1,3-octadiene. One species of these monomers may be solely used, or a combination of two or more thereof may also be used in combination.

Specific examples of the conjugated diene polymer may include a homopolymer or copolymer of a conjugated diene such as natural rubber, polyisoprene, and a butadiene-isoprene copolymer; and a copolymer of a conjugated diene with another monomer, such as a styrene-butadiene copolymer, a styrene-isoprene copolymer, an isoprene-isobutylene copolymer, an ethylene-propylene-diene-based copolymer rubber, and an aromatic vinyl-conjugated diene block copolymer such as a styrene-isoprene block copolymer. Of these, natural rubber, polyisoprene, and a styrene-isoprene block copolymer are preferred, and polyisoprene and a styrene-isoprene block copolymer are more preferred.

Further, as the conjugated diene polymer cyclized product, it is preferable to use a modified conjugated diene polymer cyclized product that has been modified with a polar group. The modified conjugated diene polymer cyclized product has an effect of causing sticky-bonding ability or adhesive-bonding ability to the adherend. If fine particles are included in the sticky-bonding function resin or adhesive-bonding function resin, the modified conjugated diene polymer cyclized product has an effect of improving the dispersibility of those fine particles. The sticky-bonding function resin or adhesive-bonding function resin may contain a single species of polar group-containing modified conjugated diene polymer cyclized product. Alternatively, the sticky-bonding function resin or adhesive-bonding function resin may contain a plurality of modified conjugated diene polymer cyclized products respectively containing a plurality of different types of polar group. In addition, a conjugated diene polymer cyclized product having two or more types of functional group may also be used.

The polar group is not particularly limited. Examples thereof may include an acid anhydride group, a carboxyl group, a hydroxyl group, a thiol group, an ester group, an epoxy group, an amino group, an amido group, a cyano group, a silyl group, and a halogen.

Examples of the acid anhydride group or carboxyl group may include groups having a structure formed by adding a vinyl carboxylic acid compound, such as maleic anhydride, itaconic anhydride, aconitic anhydride, norbornene dicarboxylic anhydride, acrylic acid, methacrylic acid, and maleic acid, to a conjugated diene polymer cyclized product. Among these, from the perspectives of reactivity and cost efficiency, a group having a structure formed by adding maleic anhydride to a conjugated diene polymer cyclized product is preferred.

The amido group may be introduced by a method in which an unsaturated compound containing an amido group is grafted onto a conjugated diene polymer cyclized product; or a method in which a functional group is introduced using an unsaturated compound containing the functional group and then this introduced functional group is reacted with a compound having an amido group. Examples of the unsaturated compound containing an amido group may include acrylamide, N-isopropylacrylamide, N,N-dimethylacrylamide, and N-benzylacrylamide.

Examples of the hydroxyl group may include groups having a structure formed by, to a conjugated diene polymer cyclized product, adding hydroxyalkyl esters of an unsaturated acid such as 2-hydroxyethyl (meth)acrylate and 2-hydroxypropyl (meth)acrylate, unsaturated amides having a hydroxyl group such as N-methylol (meth)acrylamide and N-(2-hydroxyethyl)(meth) acrylamide, polyalkylene glycol monoesters of an unsaturated acid such as polyethylene glycol mono(meth)acrylate, polypropylene glycol mono(meth) acrylate, and poly(ethylene glycol-propylene glycol) mono (meth)acrylate, and a polyhydric alcohol monoester of an unsaturated acid such as glycerol mono(meth)acrylate. Among these, hydroxyalkyl esters of an unsaturated acid are preferred, and in particular, groups having a structure formed by adding 2-hydroxyethyl acrylate or 2-hydroxyethyl methacrylate to a conjugated diene polymer cyclized product are preferred.

Examples of the vinyl compound containing other polar groups may include methyl (meth)acrylate, ethyl (meth)acrylate, butyl (meth)acrylate, glycidyl (meth) acrylate, dimethylaminoethyl (meth) acrylate, dimethylaminopropyl (meth) acrylate, (meth) acrylamide, and (meth) acrylonitrile.

Although the content of polar groups in the modified conjugated diene polymer cyclized product, particularly in the polar group-containing conjugated diene polymer cyclized product, is not particularly limited, usually the content is in the range of 0.1 to 15 mol. %, preferably in the range of 0.5 to 10 mol. %, and more preferably in the range of 1 to 7 mol. %. If this content is too low or too high, the oxygen absorption function tends to deteriorate. The polar group content is based on a molecular weight equivalent of the polar groups bound to a molecule of the modified conjugated diene polymer cyclized product of 1 mole.

Examples of the method for producing the modified conjugated diene polymer cyclized product may include: (1) a method of adding a polar group-containing vinyl compound to a conjugated diene polymer cyclized product obtained by the aforementioned method; (2) a method of cyclizing a conjugated diene polymer containing a polar group by the aforementioned method; (3) a method of adding a polar group-containing vinyl compound to a conjugated diene polymer that does not contain a polar group and then cyclizing the compound; and (4) a method of further adding a polar group-containing vinyl compound to a product obtained by the aforementioned method (2) or (3). Among these methods, from the perspective of facilitating the adjustment of the unsaturated bond decrease ratio, the aforementioned method (1) is preferred.

The polar group-containing vinyl compound is not particularly limited, as long as it can introduce a polar group onto a conjugated diene polymer cyclized product. Preferred examples thereof may include vinyl compounds having a polar group such as an acid anhydride group, a carboxyl group, a hydroxyl group, a thiol group, an ester group, an epoxy group, an amino group, an amido group, a cyano group, a silyl group, and a halogen.

Examples of the vinyl compound having an acid anhydride group or a carboxyl group may include maleic anhydride, itaconic anhydride, aconitic anhydride, norbornene dicarboxylic anhydride, acrylic acid, methacrylic acid, and maleic acid. Among these, from the perspectives of reactivity and cost efficiency, it is preferred to use maleic anhydride. Preferred examples of the hydroxyl group-containing vinyl compound may include hydroxyalkyl esters of an unsaturated acid, and in particular, 2-hydroxyethyl acrylate and 2-hydroxyethyl methacrylate.

Although the method for adding the polar group-containing vinyl compound to the conjugated diene polymer cyclized product to introduce the polar group derived from this polar group-containing vinyl compound is not particularly limited, this can be carried out based on a generally known method such as an "ene-addition reaction" or a "graft polymerization reaction". In this addition reaction, the conjugated diene polymer cyclized product and the polar group-containing vinyl compound are brought into contact with each other, optionally in the presence of a radical generator. Examples of the radical generator may include peroxides such as di-tert-butyl peroxide, dicumyl peroxide, and benzoyl peroxide, and azonitriles such as azobisisobutyronitrile.

Other than those with 100% cyclization rate, the conjugated diene polymer cyclized product has at least two kinds of unsaturated bonds, i.e., straight-chain unsaturated bonds originally in the conjugated diene and cyclic unsaturated bonds of the cyclized moiety. It is thought that, in the conjugated diene polymer cyclized product, the cyclic unsaturated bond moiety greatly contributes to oxygen absorption, whereas the straight-chain unsaturated bond moiety makes almost no contribution to oxygen absorption. Consequently, a conjugated diene polymer cyclized product that has an unsaturated bond decrease ratio in the conjugated diene polymer cyclized product based on the unsaturated bonds in the conjugated diene polymer (unsaturated bond decrease ratio) of 30% or more is preferred as the material for the oxygen absorbing member in the light-emitting element of the present invention. It is preferred that the unsaturated bond decrease ratio of the conjugated diene polymer cyclized product is 40 to 75%, and more preferably 55 to 70%. If the unsaturated bond decrease ratio is too low, the oxygen absorption properties tend to deteriorate. Setting the unsaturated bond decrease ratio of the conjugated diene polymer cyclized product to no more than the upper limit of the aforementioned preferred range can prevent the conjugated diene polymer cyclized product from becoming brittle, facilitate production, suppress gellation from progressing during production, and improve its transparency. Consequently, the device utilizing the conjugated diene polymer cyclized product can be used in a wide range of applications. Further, since sticky-bonding properties or adhesive-bonding properties are exhibited if the unsaturated bond decrease ratio exceeds 50%, this characteristic can also be utilized.

The unsaturated bond decrease ratio is an index that represents the level of reduction in unsaturated bonds due to the cyclization reaction in the conjugated diene monomer unit moiety in the conjugated diene polymer. This unsaturated bond decrease ratio is a value obtainable by the following procedure. The ratio of the peak area of the protons directly bound to a double bond relative to the peak area of all protons in the conjugated diene monomer unit moiety in the conjugated diene polymer is measured by proton NMR ($^1$H-NMR) analysis, both before and after the cyclization reaction. On the basis of the measurement results, the decrease ratio is calculated.

Regarding the conjugated diene monomer unit moiety in the conjugated diene polymer, suppose that the peak area of all protons before the cyclization reaction is SBT, the peak area of the protons directly bound to a double bond before the cyclization reaction is SBU, the peak area of all protons after the cyclization reaction is SAT, and the peak area of the protons directly bound to a double bond after the cyclization reaction is SAU. Then, the peak area ratio (SB) of the protons directly bound to a double bond before the cyclization reaction is represented as SB=SBU/SBT, and the peak area ratio (SA) of the protons directly bound to a double bond after the cyclization reaction is represented as SA=SAU/SAT. Therefore, the unsaturated bond decrease ratio can be determined by, Unsaturated bond decrease ratio (%)=100×(SB−SA)/SB The oxygen absorption amount of the conjugated diene polymer cyclized product used in the present invention is 5 ml/g or more, preferably 10 ml/g or more, and more preferably 50 ml/g. The oxygen absorption amount is the amount of oxygen that is absorbed by 1 g of conjugated diene polymer cyclized product when the conjugated diene polymer cyclized product as powders or a thin layer has become saturated by sufficient oxygen absorption at 23° C. If the oxygen absorption amount is low, a large quantity of conjugated diene polymer cyclized product is necessary in order to stably absorb oxygen for a long period of time. The oxygen absorption amount is mainly correlated with the decrease ratio of the unsaturated bond present in the conjugated diene polymer cyclized product.

In the present invention, the conjugated diene polymer cyclized product for use has a rate of oxygen absorption from its surface of 1.0 ml/m$^2$ per day or more, preferably 5.0 ml/m$^2$ per day or more, and more preferably 10 ml ml/m$^2$ per day or more. Even when the conjugated diene polymer cyclized product has a large oxygen absorption ability, if the rate of oxygen absorption is too slow, oxygen that has infiltrated from outside cannot be sufficiently absorbed, and can permeate therethrough. Further, when used as a sealing layer of the light-emitting element, oxygen that is for some reason present in the sealed space or that has infiltrated therein must be quickly removed by absorption with the conjugated diene polymer cyclized product layer. Also from such a perspective, it is preferred to have the aforementioned rate of oxygen absorption.

The content of the conjugated diene polymer cyclized product in the sticky-bonding function resin or adhesive-bonding function resin is usually 5 to 90 wt. %, and is preferably 15 to 70 wt. %. The conjugated diene polymer cyclized product content below this lower limit may cause a problem of a deterioration in the oxygen absorption ability and adhesive force at ordinary temperature (23° C.) Further, the content exceeding the aforementioned upper limit may cause a problem of a deterioration in mechanical strength.

The aforementioned alicyclic olefinic resin is an amorphous resin having an alicyclic structure, such as a cycloalkane structure or a cycloalkene structure, in its main chain and/or on a side chain. From the perspective of mechanical strength and heat resistance, a polymer containing an alicyclic structure in its main chain is preferred. Examples of the alicyclic structure may include a monocycle structure or a polycycle structure (fused polycycle, crosslinked ring etc.). Among alicyclic structures, a cycloalkane structure is preferred. Although the number of carbon atoms forming one unit of the alicyclic structure is not particularly limited, if the number is usually in the range of 4 to 30, preferably 5 to 20, and more preferably 5 to 15, properties such as mechanical strength, heat resistance, and molding properties are highly balanced, and thus the number in such a range is preferred. Specific examples of the aforementioned alicyclic olefin resin may include (1) a norbornene polymer, (2) a polymer of a monocyclic olefin, (3) a polymer of a cyclic conjugated diene, (4) a vinyl alicyclic hydrocarbon polymer, and mixtures thereof. Among these, from the perspectives of optical properties, heat resistance, and mechanical strength, a norbornene polymer and a vinyl alicyclic hydrocarbon polymer are preferred. Further, if an alicyclic olefin resin having a polar group is used as the alicyclic olefin resin, affinity with inorganic products can be improved without harming light transmittance.

Although the method for forming the sealing layer 131 is not particularly limited, the sealing layer 131 may be formed by arranging a layer of a sticky-bonding function resin or adhesive-bonding function resin such as those described above on the sealing substrate 102 and/or the second transparent electrode layer 112, attaching the sealing substrate 102 and second transparent electrode layer 112 together via the sticky-bonding function resin layer or adhesive-bonding function resin layer, and optionally heating the layers to fuse them together. The thickness of the sealing layer may be 1 to 1,000 μm.

Usually, such a sticky-bonding function resin or adhesive-bonding function resin is not capable by itself of blocking the moisture and oxygen in the air, and the blocking of the exterior air may be effected by the substrate 101 and the sealing substrate 102. However, by using a material capable of absorbing oxygen and moisture as the material of the sealing layer 131 that is sealed between the substrate 101 and sealing substrate 102, deterioration of the light-emitting element 120 can be more effectively prevented, so that a light source device having a longer life can be produced.

(Reflective Surface)

The light source device of the present invention has a specific relationship between the shape of the reflective surface of the reflective layer and the refractive index of a structural layer X that is provided between the second transparent electrode layer and the reflective surface and is in contact with the reflective surface. Specifically, a refractive index n of the structural layer X, an inclination angle θ×1 of a concavo-convex structure unit, and a mean inclination angle θ×2 of the concavo-convex structure unit of the reflective surface satisfy the following expressions (1) and (2).

$$\theta \times 1 \leq \sin^{-1}(1/n) \quad (1)$$

$$\{90 - \sin^{-1}(1/n)\}/3 \leq \theta \times 2 \leq \sin^{-1}(1/n) \text{tm} \quad (2)$$

The element in the first embodiment corresponding to the structural layer X is the adhesion layer 132. Further, the surface of the reflective layer 142 in contact with the adhesion layer 132 serves as the reflective surface of the reflective layer. The reflective portion composite substrate 140 serves as a member that defines the concavo-convex structure of the reflective surface. Specifically, by providing the reflective layer 142 along the concavo-convex structure of the concavo-convex structure portion 141 of the reflective portion composite substrate 140, the concavo-convex structure of the reflective surface of the reflective layer 142 has the same shape as the concavo-convex structure of the concavo-convex structure portion 141. Therefore, a desired reflective surface shape can be obtained by forming the reflective portion composite substrate 140 so that the shape of the surface of the concavo-convex structure portion 141 satisfies the relationship of the aforementioned formulae (1) and (2), and forming the reflective layer 142 having a uniform thickness on the thus-formed reflective portion composite substrate 140. However, the reflective layer in the present invention is not limited to those having a uniform thickness. For example, the reflective layer may also be formed of a concavo-convex metal layer on a flat substrate.

Figure 2:
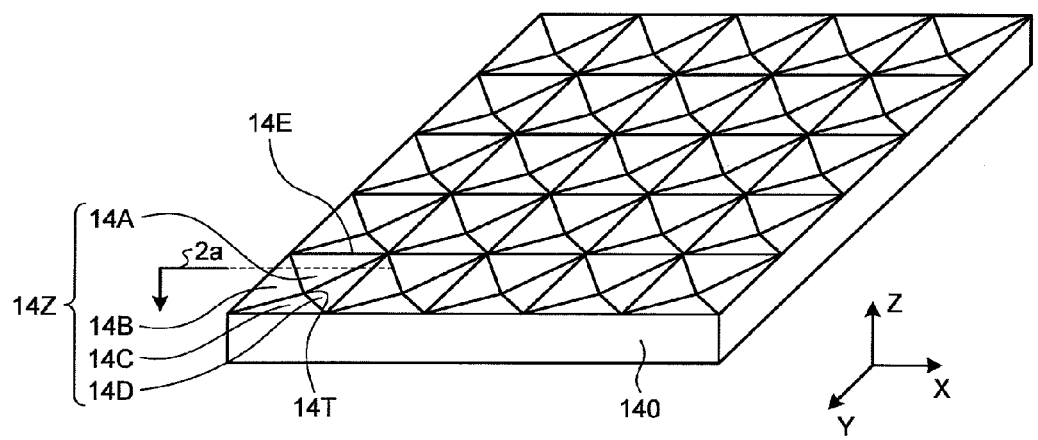
FIG. 2 is an enlarged perspective view schematically illustrating the concavo-convex structure portion 141 of a reflective portion composite substrate 140 illustrated in FIG. 1.

An example of the detailed structure of the concavo-convex structure portion 141 according to the first embodiment is illustrated in FIG. 2. FIG. 2 is an enlarged perspective view schematically illustrating the concavo-convex structure portion 141 of the reflective portion composite substrate 140 illustrated in FIG. 1. In the first embodiment, the shape of the reflective surface of the reflective layer 142 is the same shape as the surface shape of the concavo-convex structure portion 141.

The concavo-convex structure of the reflective portion composite substrate 140 is a structure in which a plurality of concavo-convex structure units 14Z, which are depressions with a quadrangular pyramid shape, are aligned. In this example, the concavo-convex structure units 14Z are continuously aligned in two in-plane directions (the X axis direction and the Y axis direction in FIG. 2) that bisect each other.

Each of the concavo-convex structure units 14Z has four oblique faces 14A to 14D and an apex 14T. The angle between each of the four oblique faces 14A to 14D and the horizontal plane is the same. The bottom face of the quadrangular pyramid shape of the concavo-convex structure units 14Z is in a square shape. Bottom edges 14E of the quadrangular pyramid shape of the concavo-convex structure units 14Z are in contact with the bottom edges of other concavo-convex structure units 14Z. Consequently, the concavo-convex structure units 14Z are continuously arranged without any gaps on the concavo-convex structure. Although the concavo-convex structure units 14Z are continuously arranged without any gaps in the present embodiment, the concavo-convex structure units 14Z may also be arranged so that there is a gap to an adjacent unit. In this case, it is preferred that the separated portion (gap) is a flat plane.

Figure 3:
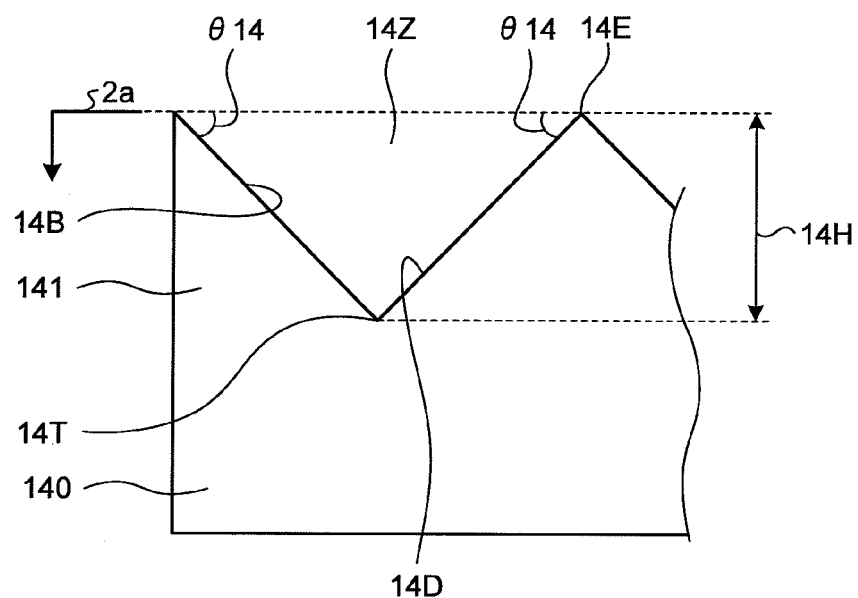
FIG. 3 is a partial cross-sectional view illustrating a concavo-convex structure unit 14Z of the reflective portion composite substrate 140 illustrated in FIG. 2 along a plane that passes through the line 2a parallel to the bottom edge 14E and that is parallel to the Z axis direction.

FIG. 3 is a partial cross-sectional view illustrating the concavo-convex structure unit 14Z of the reflective portion composite substrate 140 along a plane that passes through the line 2a parallel to the bottom edge 14E and that is parallel to the Z axis direction. An angle θ14 formed between the oblique faces 14B and 14D and the horizontal plane is an inclination angle θ×1 of the concavo-convex structure unit 14Z. Further, since the shape of the concavo-convex structure units 14Z is the same across the overall surface having the concavo-convex structure of the concavo-convex structure portion 141, the inclination angle θ14 of the concavo-convex structure unit 14Z is also the mean inclination angle θ×2 of the concavo-convex structure of the reflective surface.

In the present invention, if the concavo-convex structure has a plurality of differently shaped concavo-convex structure units, the maximum angle among the plurality of concavo-convex structures is taken as the inclination angle θ×1 of those units. Further, when there is a flat portion between the concavo-convex structure units, the flat portion is excluded when determining the mean inclination angle.

In the present invention, if the concavo-convex structure has a plurality of types of slope or has curved surfaces and is more complex than the aforementioned example, the mean inclination angle θ×2 is defined as follows. That is, the reflective surface is divided into n-number of tiny surface areas sufficiently smaller than the concavo-convex structure unit. Each of these tiny surface areas is defined as $\Delta Si$, the value of the angle between this $\Delta Si$ and the substrate flat surface is defined as $\theta i$, and the mean inclination angle is then defined by the following formula (5).

$$\text{Mean inclination angle} = \sum_{i=0}^{n} (\Delta Si \times |\theta i|) \Big/ \sum_{i=0}^{n} \Delta Si$$

In the formula (5), $\Sigma \Delta Si$ represents the total surface area of the reflective layer. In the light source device of the present invention, when the thus-defined mean inclination angle of the reflective layer satisfies the aforementioned specific requirement, a high light extraction efficiency can be realized.

The reflective portion composite substrate 140 may be molded so that the concavo-convex structure portion 141 and portions below that are integrally molded with a common material. Alternatively, the concavo-convex structure portion 141 and the portions below that may be molded with different materials.

When the concavo-convex structure portion 141 and the portions below that are integrally molded with a common material, examples of the material therefor may include the same material as that forming the substrate 101 and sealing substrate 102. From the perspective of facilitating manufacture of the concavo-convex structure portion 141, a plastic substrate is preferred. More specifically, a material formed of the aforementioned alicyclic olefin resin and the like may be used.

When the concavo-convex structure portion 141 and the portions below that are molded with different materials, the same material as described above may be used for the portions below the concavo-convex structure portion 141. On the other hand, as the material for forming the concavo-convex structure portion 141, from the perspective of facilitating molding process, a resin that can be cured with an energy beam such as UV-rays is preferred. Specifically, a material such as a (meth)acrylate-based energy beam-curable resin may be used. The concavo-convex structure portion 141 having a desired concavo-convex structure may be easily formed by coating with such a resin the surface of a specific substrate that forms a part of the aforementioned portions below the concavo-convex structure portion 141, pressing a mold having a desired shape against the coated resin, and curing the resin by irradiation of the resin with an energy beam from the sealing substrate 102 side.

The thickness of the reflective portion composite substrate 140 may be 25 to 500 μm. The height of the depressions/protrusions of the concavo-convex structure may be 0.3 to 100 μm. The width of the depressions/protrusions of the concavo-convex structure may be 0.6 to 200 μm.

The reflective layer 142 may be provided by, for example, forming one or a plurality of layers of a metal on a member defining the concavo-convex structure, such as the reflective portion composite substrate. Examples of metals that may be used for this metal layer may include aluminum and alloys thereof, silver and alloys thereof and the like. Silver is particularly preferred because of its high reflectance.

It is preferred that the reflective layer is a stacked body formed of a first metal layer including a first metal and a second metal layer including a second metal which is different from the first metal. Specifically explaining, if silver, which has a high reflectance, is provided at a thickness that can obtain a sufficient reflectance, production costs increase. Then the reflective layer may be formed by employing silver and aluminum, which is cheaper but has poorer reflectance than silver, for the first and second metals respectively, and stacking an aluminum layer and a silver layer. More specifically, the reflective layer may be formed by providing a silver layer on an upper side of an aluminum layer and using this silver layer as the reflective surface. Preferably, the layer of silver is provided in direct contact with the top of the aluminum layer.

Particularly, when the reflective layer 142 is made of metal, the role of blocking oxygen and moisture in the air from infiltrating into the light-emitting element can also be achieved by the reflective layer 142 in addition to the sealing substrate 102.

(Adhesion Layer)

In the first embodiment, although the same materials as those exemplified for the sealing layer 131 (various sticky-bonding function resins or adhesive-bonding function resins) may be used for the material forming the adhesion layer 132 for causing adhesion of the sealing substrate 102 and the reflective layer 142, the material for the adhesion layer 132 is not limited to those examples. For example, various known adhesives for effecting adhesion of optical members and the like may be used. Specifically, Aron Alpha (registered trademark) manufactured by Toagosei Co., Ltd., and the like may be used. If the adhesion layer serves as the structural layer X in the present invention, it is preferred that the refractive index of the adhesion layer is in the below-described preferred range as the refractive index n of the structural layer X.

The method for forming the adhesion layer 132 is not particularly limited. The adhesion layer 132 may be formed by coating a composition for forming the adhesion layer on the surface of the sealing substrate 102 and/or reflective layer 142, attaching the sealing substrate 102 and reflective layer 142 together via the coated layer of this composition, and optionally photocuring, heating, and drying it. The thickness of the reflective layer may be 1 to 1,000 μm. It is preferred to provide the adhesion layer 132 on the reflective surface so that the concavo-convex structure of the reflective surface is filled therewith and the surface becomes flat.

(Diffusion Layer)

The organic EL light source device of the present invention may further include optional layers in addition to the essential components that are the first transparent electrode layer, light-emitting layer, second transparent electrode layer, structural layer X, and reflective layer. For example, the organic EL light source device may further include a light diffusion layer provided on the light-emitting surface side of the reflective layer.

This diffusion layer may be provided at an arbitrary position on the light-emitting surface side of the reflective layer. The diffusion layer may be provided as a separate layer from the aforementioned layers that are essential components. Alternatively, the diffusion layer may be provided as a layer that also serves as a layer that is an essential component, such as the structural layer X. The diffusion layer may be any of the layers described above, for example, the substrate, sealing substrate, sealing layer, sticky-bonding layer, and adhesion layer, to which a function as a diffusion layer is imparted. Specifically, the diffusion layer is a layer positioned below but close to the light-emitting element, and may be formed of a material to which a diffusing agent can be easily added, such as a resin. For example, in the first embodiment, it is preferred to impart a function as a diffusion layer to the sealing layer 131, thereby using this layer as the diffusion layer. Although the material for the diffusion layer is not particularly limited, it is preferred that the material is a resin that forms, e.g., the sealing layer to which a diffusing agent is added. A structure in which a material having a refractive index higher than glass and containing a diffusing agent added thereto is used as the sealing layer is particularly preferred because light extraction efficiency can be improved while also suppressing the metallic luster of the reflective layer. The haze of the diffusion layer may be 25 to 95%, and more preferably 70 to 90%. By setting the haze range to no less than the aforementioned lower limit, effects of the diffusion layer can be obtained. Further, by setting the haze range to no more than the aforementioned upper limit, a thin layer thickness can be obtained. By incorporating such a diffusion layer into the light source device, light interference in the device can be further decreased and a higher extraction efficiency can be realized.

(Light Path)

In the organic EL light source device of the first embodiment, the light-emitting layer 121 emits light by application of a voltage to the first transparent electrode layer 111 and the second transparent electrode layer 112. The produced light emits from the light-emitting layer 121 in arbitrary directions.

Part of the light that is emitted upwards passes through the first transparent electrode layer 111, through the substrate 101, and is emitted from a light-emitting surface 100A. However, the light that is reflected at the interfaces proceeds in a downward direction. Particularly, light that is incident on an interface at a greater angle than the critical angle of the interface is totally reflected, and all of such light proceeds in a downward direction.

Much of the light that is emitted from the light-emitting layer in a downward direction passes through the second transparent electrode layer 112, then passes through the sealing layer 131, the sealing substrate 102, and the adhesion layer 132, and reaches the reflective surface of the reflective layer 142.

Generally, if reflection at the layer interfaces in the device is repeated many times, the energy of the light is lost due to interference and absorption. Therefore, from the perspective of increasing the light extraction efficiency, it is preferred that the light that has been emitted in a downward direction is reflected in a direction which does not repeat total reflection.

Here, a case in which light that has reached the structural later X (in the first embodiment, the adhesion layer 132) and been reflected by the reflective surface is emitted from light-emitting surface of the device will be considered. In this case, even if another layer is present between the light-emitting surface of the device and the structural layer X, the reflected light is in the end emitted from the device towards the exterior, which is a layer of air. Consequently, among the angle range of the light rays that are reflected by the reflective surface and then directed toward the light-emitting surface side of the device at various angles, the angle range in which the light can go out of the light-emitting surface of the device while keeping that angle (i.e., without light path direction change other than change by refraction (diffusion due to a diffusing agent, refraction and reflection at a surface that is not parallel to the light-emitting surface of the device etc.)) depends, in the end, on the relative refractive index of the structural layer X which is the layer in contact with the reflective surface, and the air layer. This relative refractive index can simply be approximated by the refractive index n of the structural layer X.

More specifically, when light proceeding downwards through the structural layer X in a direction in which the angle with respect to the Z axis direction is greater than the critical angle at an interface between the structural layer X and the air layer (hereinafter simply referred to as "critical angle of structural layer X") is reflected at the reflective surface and proceeds in an upward direction, it is desired that as much of the reflected light as possible proceed in a direction in which the angle with respect to the Z axis direction is smaller than the critical angle of structural layer X. Here, if the reflective surface satisfies the aforementioned expressions (1) and (2), the ratio of reflection in such a desired manner increases, and thereby the extraction efficiency can be improved.

In the present invention, it is more preferred that the mean inclination angle θ×2 satisfy the following expression (3), and even more preferred that it satisfy the following expression (4).

$$\{90-\sin^{-1}(1/n)\}/2 \leqq \theta \times 2 \leqq \sin^{-1}(1/n) \tag{3}$$

$$(\{90+\sin^{-1}(1/n)\}/4)-5 \leqq \theta \times 2 \leqq (\{90+\sin^{-1}(1/n)\}/4)+5 \tag{4}$$

Figure 10:
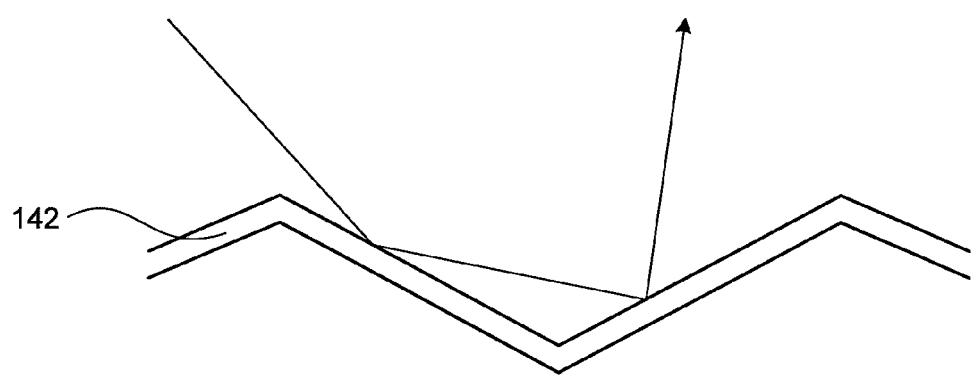
FIG. 10 is a partial cross-sectional view schematically illustrating an example of reflection of light at a reflective surface.

When the reflective surface has a shape in which pyramids are aligned without any gap between them, it is particularly preferred that the reflective surface satisfy the aforementioned expression (3), because even with two consecutive reflections as illustrated by the arrow in FIG. 10, when the light proceeding downwards through the structural layer X at an angle greater than the critical angle of the structural layer X is reflected by the reflective surface and proceeds upwards, most of the light proceeds in a direction in which the angle with respect to the Z axis direction is smaller than the critical angle of the structural layer X.

Further, when the aforementioned expression (4) is satisfied, the light in the direction in which the angle with respect to the Z axis direction is an angle within a range from the critical angle of the structural layer X to 90° (for example, when n=1.53 and the critical angle is 40.8°, light in the direction in which the angle with respect to the Z axis direction is 65.4°, which is 40.8 to) 90° can be reflected in a direction that is close to the Z axis direction. Consequently, even more preferred reflection can be achieved.

The ranges of the aforementioned expressions (2) to (4) when the refraction index n is a variety of representative refractive index values are as follows.

When n=1.5, expression (2): 16.1≦θ×2≦41.8, expression (3): 24.1≦θ×2≦41.8, expression (4): 28.0≦θ×2≦38.0.

When n=1.6, expression (2): 17.1≦θ×2≦38.7, expression (3): 25.7≦θ×2≦38.7, expression (4): 27.2≦θ×2≦37.2.

When n=1.8, expression (2): 18.8≦θ×2≦33.7, expression (3): 28.1≦θ×2≦33.7, expression (4): 25.9≦θ×2≦35.9.

When n=1.9, expression (2): 19.4≦θ×2≦31.8, expression (3): 29.1≦θ×2≦31.8, expression (4): 25.4≦θ×2≦35.4.

It is preferred that the value of the refractive index n of the structural layer X is equal to or greater than the refractive index of the substrate and the sealing substrate. If the substrate and sealing substrate are formed of an ordinary material such as a glass or a film, the lower limit for the refractive index n of the structural layer X is preferably 1.5 or more, and more preferably 1.6 or more. On the other hand, since the refractive index of the structural layer X does not have to be equal to or greater than the refractive index of the light-emitting element, the upper limit for the refractive index of the structural layer X is preferably 1.9 or less. In the present invention, the refractive index may be set based on light having a wavelength of 550 nm.

(Second Embodiment)

Figure 4:
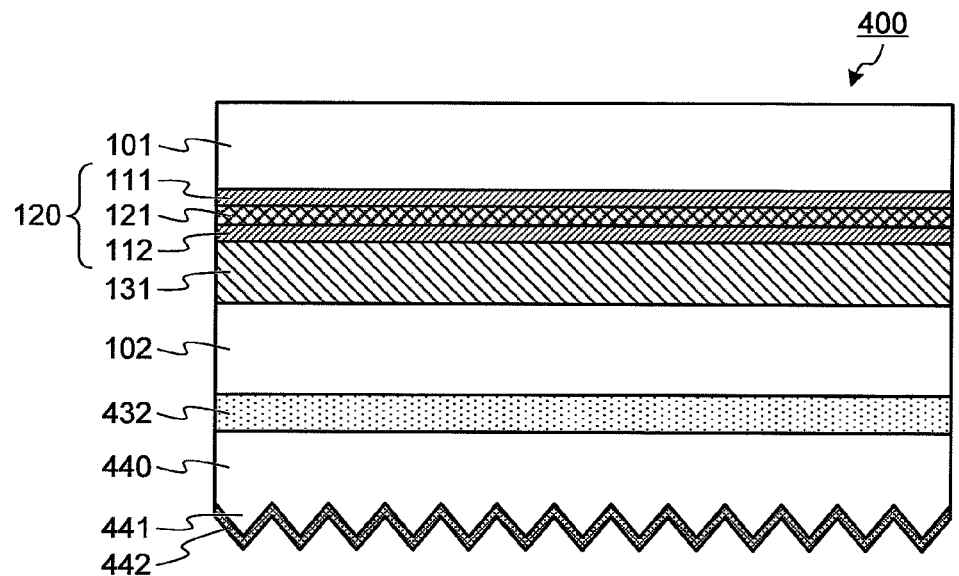
FIG. 4 is an elevated cross-sectional view schematically illustrating a layer configuration of an organic EL light source device according to a second embodiment of the present invention.

FIG. 4 is an elevated cross-sectional view schematically illustrating a layer configuration of an organic EL light source device according to a second embodiment of the present invention. In FIG. 4, a device 400 differs from the first embodiment in that it includes a transparent concavo-convex layer 440 having a concavo-convex structure portion 441 on its lower surface, and a reflective layer 442 provided on the lower surface of the concavo-convex structure portion 441. The transparent concavo-convex layer 440 is provided on a lower side of the sealing substrate 102 via an adhesion layer 432. In the second embodiment illustrated in FIG. 4, the transparent concavo-convex layer 440 is the member that defines the concavo-convex structure of the reflective surface of the reflective layer. Specifically, the reflective layer 442 is provided along the concavo-convex structure portion 441 of the transparent concavo-convex layer 440, whereby the reflective surface of the reflective layer 442 is of a shape that has the specific concavo-convex structure of the present invention.

In the second embodiment, it is not the adhesion layer 432 but the transparent concavo-convex layer 440 that serves as the structural layer X. Further, the surface of the reflective layer 442 that is in contact with the concavo-convex structure portion 441 of the transparent concavo-convex layer 440 serves as the reflective surface of the reflective layer. With such a configuration, the requirements of the present invention can also be satisfied, and the desired effect that are a high light extraction efficiency and other effects can be obtained.

Similar to the reflective portion composite substrate 140, the transparent concavo-convex layer 440 may be molded so that the concavo-convex structure portion 441 and the portions above that are integrally molded with a common material. Alternatively, the concavo-convex structure portion 441 and the portions above that may be molded with different materials. The materials and the production method for the transparent concavo-convex layer 440 may be the same as those described above for the reflective portion composite substrate 140. The thickness of the transparent concavo-convex layer 440 may be 1 to 500 µm. The height of the depressions/protrusions of the concavo-convex structure may be 0.3 to 100 µm. The width of the depressions/protrusions of the concavo-convex structure may be 0.6 to 200 µm.

(Third Embodiment)

FIG. 5 is an elevated cross-sectional view schematically illustrating a layer configuration of an organic EL light source device according to a third embodiment of the present invention. The third embodiment is a further modified example of the second embodiment illustrated in FIG. 4. In FIG. 5, a device 500 differs from the second embodiment in that it includes a concavo-convex structure portion 541 that consists of a transparent resin and is formed directly on the lower surface of the sealing substrate 102 without intervention of the adhesion layer, and a reflective layer 542 that is provided along the concavo-convex structure portion 541.

In the third embodiment, the concavo-convex structure portion 541 serves as the structural layer X. Further, the surface of the reflective layer 542 that is in contact with the concavo-convex structure portion 541 serves as the reflective surface of the reflective layer. In addition, the concavo-convex structure portion 541 is the member that defines the concavo-convex structure of the reflective surface of the reflective layer. With such a configuration, the reflective layer 542 can also be configured so as to have the specific concavo-convex structure of the present invention. Therefore, with such a configuration, the requirements of the present invention can be satisfied, and the desired effect that are a high light extraction efficiency and other effects can be obtained.

(Fourth Embodiment)

FIG. 6 is an elevated cross-sectional view schematically illustrating a layer configuration of an organic EL light source device according to a fourth embodiment of the present invention. As illustrated in FIG. 6, a light source device 600 of the fourth embodiment includes a light-emitting element 620 formed by stacking, on a substrate 601, a second transparent electrode layer 612, a light-emitting layer 621, and a first transparent electrode layer 611 in this order, and a sealing substrate 602 that is provided on the light-emitting element 620 via a sealing layer 631. On the other hand, similar to the first embodiment, the reflective layer 142 provided on the concavo-convex structure portion 141 of the upper surface of the reflective portion composite substrate 140 is provided on the lower surface of the substrate 601 via the adhesion layer 132. In the fourth embodiment, an upper surface 602A of the sealing substrate 602 serves as the light-emitting surface of the light source device. Further, similar to the first embodiment, the adhesion layer 132 serves as the structural layer X, and the face of the reflective layer 142 that is in contact with the adhesion layer 132 serves as the reflective surface of the reflective layer.

Thus, when the device is configured so that light is emitted from the surface 602A of the sealing substrate 602, which is the substrate on the opposite side to the substrate 601 on which the light-emitting element is formed, the requirements of the present invention (i.e., a configuration having a first transparent electrode layer, a light-emitting layer, a second transparent electrode layer, and a reflective layer having the specific reflective surface in this order) can be satisfied. Consequently, the requirements of the present invention can be satisfied, and the desired effect that are a high light extraction efficiency and other effects can be obtained. Although the refractive index of the substrate 601 is not particularly limited, it is preferred that the substrate have a high refractive index of 1.5 or more, and more preferably of 1.6 or more. If a substrate having such a refractive index is used, the lower limit for the refractive index of the adhesion layer 132 (the structural layer X in this embodiment) is preferably 1.5 or more, which is the same as the substrate, and more preferably 1.6 or more. On the other hand, since the refractive index does not have to be equal to or greater than the refractive index of the light-emitting element, the upper limit for the refractive index of the adhesion layer 132 is preferably 1.9 or less.

(Fifth Embodiment)

Figure 7:
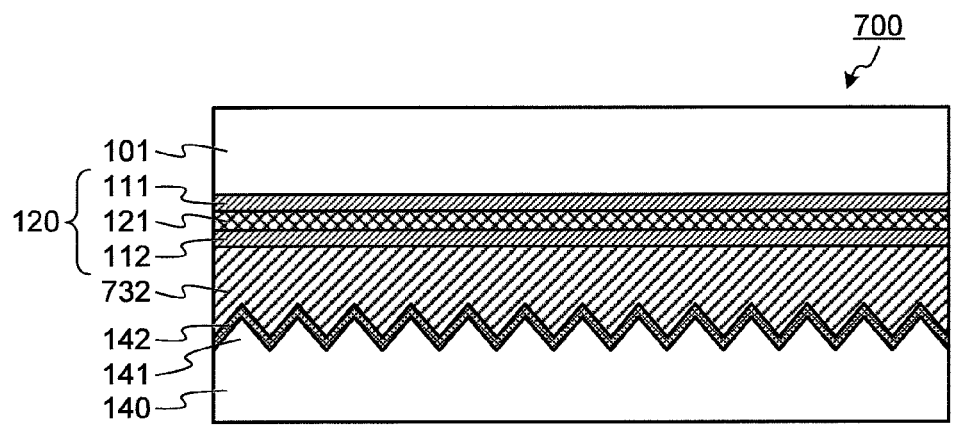
FIG. 7 is an elevated cross-sectional view schematically illustrating a layer configuration of an organic EL light source device according to a fifth embodiment of the present invention.

FIG. 7 is an elevated cross-sectional view schematically illustrating a layer configuration of an organic EL light source device according to a fifth embodiment of the present invention. The fifth embodiment is a modified example of the first embodiment illustrated in FIG. 1. In FIG. 7, a device 700 differs from the first embodiment in that it has a sealing adhesion layer 732 in place of the sealing layer 131, sealing substrate 102, and adhesion layer 132, on the lower side of the second transparent electrode layer 112. Specifically, in the fifth embodiment, the sealing adhesion layer 732 is in direct contact with both the second transparent electrode layer 112 and the reflective layer 142.

In the fifth embodiment, the sealing adhesion layer 732 serves as the structural layer X. Further, the surface of the reflective layer 142 in contact with the sealing adhesion layer 732 serves as the reflective surface of the reflective layer.

In the fifth embodiment, instead of the sealing substrate 102, the reflective layer 142 blocks infiltration of oxygen, moisture and the like in the air into the light-emitting element 120 (first transparent electrode layer 111, light-emitting layer 121, and second transparent electrode layer 112). Consequently, deterioration can be prevented with a simpler layer configuration, whereby a light source device that is thin and inexpensive and has a long life can be obtained.

As in the fifth embodiment, when the reflective layer 142 functions as a barrier for blocking the oxygen, moisture and the like in the air, it is preferred that the material for forming the reflective layer 142 includes a layer of a metal such as aluminum and silver. Further, although this metal layer may be formed of a single layer of one type of metal, the metal layer may also be configured from a plurality of layers. In a reflective layer that is configured from a plurality of layers, the respective layers forming the reflective layer may be formed of the same metal or from different metals. In addition, the reflective layer may also be configured by stacking a functional layer of an inorganic thin layer or an organic thin layer and a metal layer. It is more preferred to, as described above, provide a silver layer on an aluminum layer and use this silver layer as the reflective surface.

From the perspective of securing a reflective performance and a barrier performance, it is preferred that the thickness of the reflective layer 142 is 0.1 to 10 µm. Generally, when sealing an organic EL light-emitting element with a metal layer, a water vapor barrier property of $10^{-5}$ g/m$^2$ per day or lower is required. However, in the present invention, by appropriately selecting the sealing adhesion layer and the reflective portion composite substrate, a high barrier performance can be obtained with a thin metal reflective layer that can be easily produced. Further, although not illustrated in the drawing, from the same perspective of securing a barrier performance, a barrier layer may be formed between the sealing adhesion layer 732 and the transparent electrode layer 112. Examples of such a barrier layer may include various metal oxides and metal nitrides, such as $SiO_2$, SiON, SiN, SiOC, and $Al_2O_3$. Although not either illustrated in the drawing, instead of the sealing adhesion layer 732, an energy beam curable resin such as an acrylate resin, a methacrylate resin resin and the like, sticky-bonding function resins and adhesive-bonding function resins of an acrylic type, an olefinic type and the like, a thermofusion type adhesive-bonding function resin that melts when heated and hardens when cooled, an inactive liquid such as a fluorohydrocarbon, silicon oil and the like, and liquid crystal material of nematic liquid crystals, smectic liquid crystals and the like that can be used as a sealing layer can be used. Particularly, employment of a material having high fluidity facilitates the filling of the concavo-convex structure of the reflective layer with the sealing layer.

It is preferred that the refractive index of the sealing adhesion layer 732 (in the present embodiment, the structural layer X) is equal to or greater than the refractive index of the substrate and the sealing substrate. If the substrate and sealing substrate are formed of an ordinary material such as a glass or a film, the lower limit for the refractive index n of the sealing adhesion layer 732 is preferably 1.5 or more, and more preferably 1.6 or more. On the other hand, since the refractive index does not have to be equal to or greater than the refractive index of the light-emitting element, the upper limit for the refractive index n of the sealing adhesion layer 732 is preferably 1.9 or less.

(Sixth Embodiment)

Figure 8:
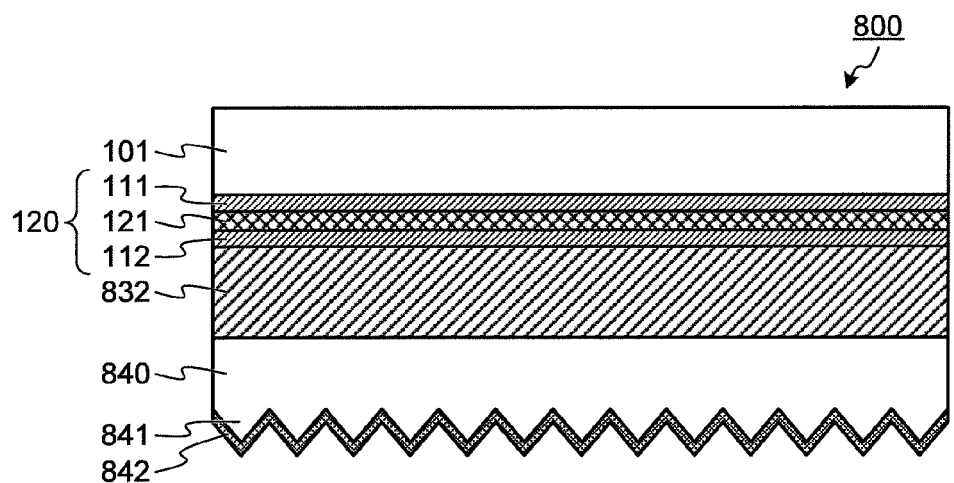
FIG. 8 is an elevated cross-sectional view schematically illustrating a layer configuration of an organic EL light source device according to a sixth embodiment of the present invention.

FIG. 8 is an elevated cross-sectional view schematically illustrating a layer configuration of an organic EL light source device according to a sixth embodiment of the present invention. The sixth embodiment is a further modified example of the fifth embodiment illustrated in FIG. 7. In FIG. 8, a device 800 differs from the fifth embodiment in that it includes a transparent concavo-convex layer 840 having a concavo-convex structure portion 841 formed on its lower surface, and a reflective layer 842 provided on the lower surface of the concavo-convex structure portion 841 that is formed on the lower surface of the transparent concavo-convex layer 840. The transparent concavo-convex layer 840 is provided on a lower side of the second transparent electrode layer 112 via a sealing adhesion layer 832. In the sixth embodiment, the transparent concavo-convex layer 840 serves as the structural layer X. Further, the surface of the reflective layer 842 in contact with the concavo-convex structure portion 841 of the transparent concavo-convex layer 840 serves as the reflective surface of the reflective layer.

In the sixth embodiment, due to the reflective layer 842 being arranged along the concavo-convex structure of the concavo-convex structure portion of the transparent concavo-convex layer 840, the reflective layer 842 can have the specific concavo-convex structure of the present invention, and, similar to the fifth embodiment, the reflective layer can block oxygen, moisture and the like in the air from infiltrating into the light-emitting element. Consequently, with such a configuration, the light extraction efficiency can be increased, and the resulting light source device can be thin and inexpensive and have a long life.

(Seventh Embodiment)

Figure 9:
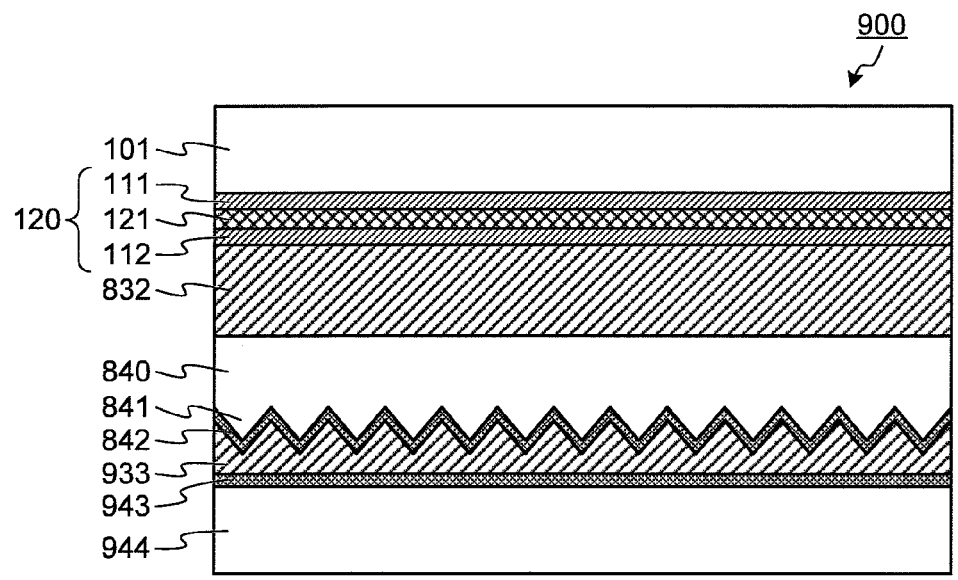
FIG. 9 is an elevated cross-sectional view schematically illustrating a layer configuration of an organic EL light source device according to a seventh embodiment of the present invention.

FIG. 9 is an elevated cross-sectional view schematically illustrating a layer configuration of an organic EL light source device according to a seventh embodiment of the present invention. The seventh embodiment is a further modified example of the sixth embodiment illustrated in FIG. 8. In FIG. 9, a device 900 differs from the sixth embodiment in that it has a sealing metal layer 943 and a substrate 944 thereof on an even lower side of the reflective layer 842 via a sealing layer 933. In the seventh embodiment, the transparent concavo-convex layer 840 serves as the structural layer X. Further, the surface of the reflective layer 842 in contact with the concavo-convex structure portion 841 of the transparent concavo-convex layer 840 serves as the reflective surface of the reflective layer. The sealing layer 933, sealing metal layer 943, and substrate 944 thereof are not involved in the passage or reflection of light.

The material forming the reflective layer 842 and the material forming the metal layer 943 may be the same or different. Further, the thickness of these layers may be the same or different. In the seventh embodiment, the provision of the separate metal layer 943 in addition to the reflective layer 842 enables employment of a layer having a high sealing performance as the sealing metal layer 943 regardless of its reflectance performance, whereby, even when a layer having a high reflectance performance but a low sealing performance is used as the reflective layer 842, the reflection performance can be increased and the oxygen, moisture and the like in the air can be blocked from infiltrating into the light-emitting element to a better extent than those in the sixth embodiment. Consequently, with such a configuration, the light extraction efficiency can be increased, and the resulting light source device can be thin and inexpensive and have a long life.

(Other Modified Examples: Concavo-convex Structure)

In the aforementioned embodiments, a periodic structure in which quadrangular pyramid-shaped concavo-convex structure units were continuously aligned in two directions was exemplified as the concavo-convex structure of the reflective layer. However, the concavo-convex structure of the present invention is not limited thereto. The concavo-convex structure may be in a variety of forms as long as the relationships of the refractive index of the structural layer X, the inclination angle θ×1 of the concavo-convex structure units and the mean inclination angle of the concavo-convex structure fall within the aforementioned ranges.

In addition to the quadrangular pyramid shape described above, the concavo-convex structure unit may also be depressions and/or protrusions in any of a variety of shapes, such as an arbitrary pyramid or prismoid shape, a shape formed by rounding a pyramid apex and/or edges, a shape formed of a part of a sphere or an oval sphere, and a combination of these shapes. Further, the concavo-convex structure may also be configured by arranging a plurality of concavo-convex structure units that have a columnar shape, such as a part of a cylinder or a rectangular column so that the longitudinal direction of these columnar shapes is directed in the horizontal direction and parallel to each other.

Further, the concavo-convex structure is not limited to a configuration in which the concavo-convex structure units are arranged without gaps. The concavo-convex structure may be configured of a plurality of concavo-convex structure units, which are depressions and/or protrusion, and a flat portion provided in gaps between these concavo-convex structure units.

Specific examples of the concavo-convex structure of the reflective layer other than the example illustrated in FIGS. 2 and 3 will now be described hereinbelow by illustrating a reflective portion composite substrate having a concavo-convex structure corresponding thereto.

Figure 11:
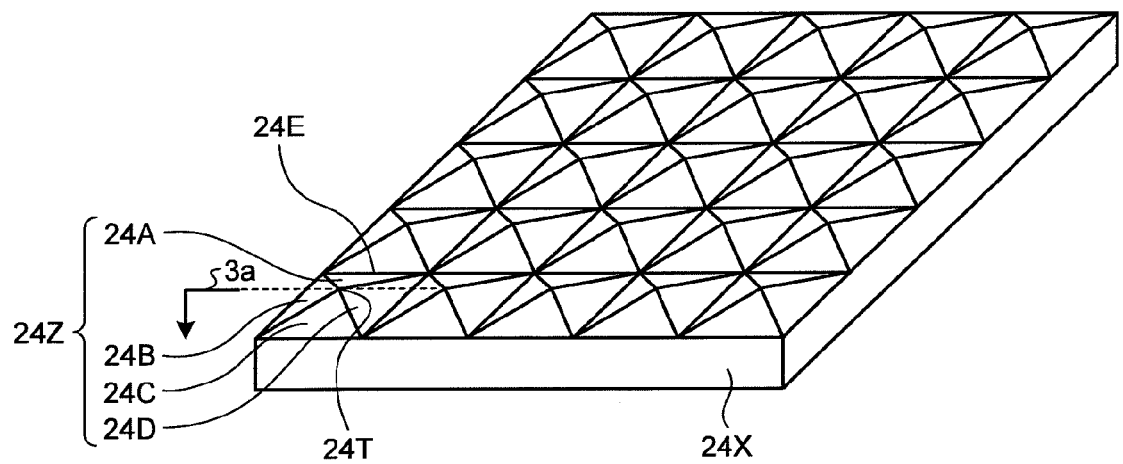
FIG. 11 is a perspective view schematically illustrating a modified example of the reflective portion composite substrate 140 having the concavo-convex structure portion 141 of the first embodiment.

FIG. 11 is a perspective view schematically illustrating a modified example of the reflective portion composite substrate 140 having the concavo-convex structure portion 141 of the first embodiment. In FIG. 11, the concavo-convex structure of the reflective portion composite substrate 24X is a structure in which concavo-convex structure units 24Z, which are quadrangular pyramid protrusions, are continuously provided in two directions in the plane. In this example, the concavo-convex structure units 24Z have four oblique faces 24A to 24D and an apex 24T. The angle between each of the four oblique faces 24A to 24D and the horizontal plane is the same. The bottom face of the quadrangular pyramid shape of the concavo-convex structure units 24Z is a square. Bottom edges 24E of the quadrangular pyramid shape of the concavo-convex structure units 24Z are in contact with the bottom edges of other concavo-convex structure units 24Z. Consequently, the concavo-convex structure units 24Z are continuously arranged without any gaps on the concavo-convex structure.

Figure 12:
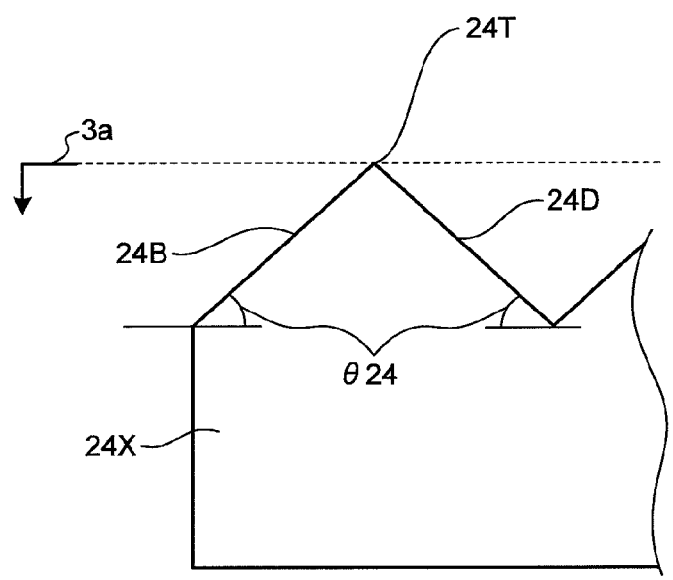
FIG. 12 is a partial cross-sectional view illustrating a concavo-convex structure unit 24Z of the reflective portion composite substrate 240 illustrated in FIG. 11 along a plane that passes through the line 3a parallel to the bottom edge 24E and that is parallel to the Z axis direction.

FIG. 12 is a partial cross-sectional view illustrating a concavo-convex structure unit 24Z of the reflective portion composite substrate 240 illustrated in FIG. 11 along a plane that passes through the line 3a parallel to the bottom edge 24E and that is parallel to the Z axis direction. An angle θ24 between the oblique faces 24B and 24D and the horizontal plane is an inclination angle θ×1 of the concavo-convex structure unit 24Z. Further, since the shape of the concavo-convex structure units 24Z is the same across the overall surface having the concavo-convex structure of the concavo-convex structure portion 241, the inclination angle θ24 of the concavo-convex structure unit 24Z is also the mean inclination angle θ×2 of the concavo-convex structure of the reflective surface.

Figure 13:
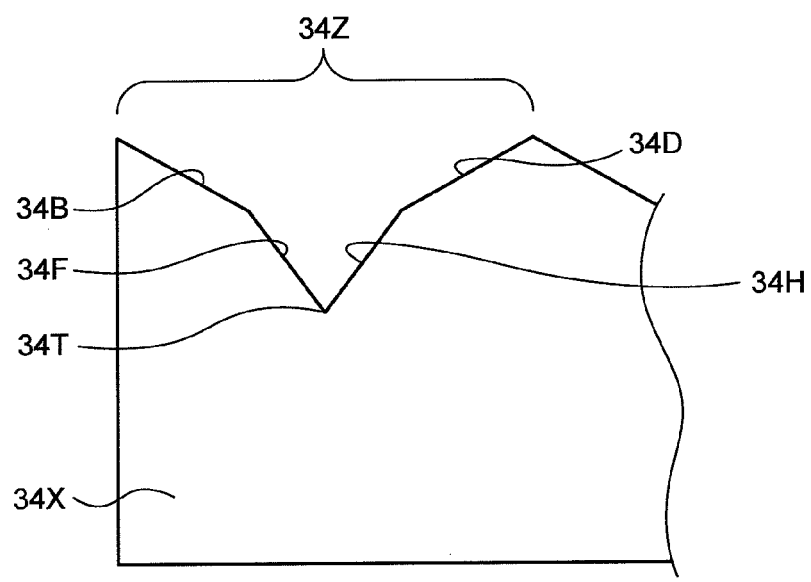
FIG. 13 is a partial cross-sectional view schematically illustrating a modified example of the concavo-convex structure unit 14Z of the reflective portion composite substrate 140 having the concavo-convex structure portion 141 in the first embodiment.
Figure 14:
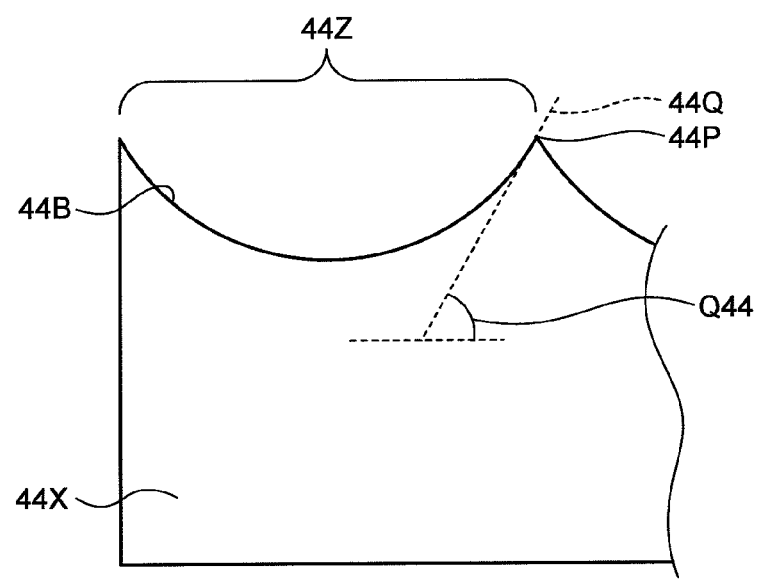
FIG. 14 is a partial cross-sectional view schematically illustrating a modified example of the concavo-convex structure unit 14Z of the reflective portion composite substrate 140 having the concavo-convex structure portion 141 in the first embodiment.
Figure 15:
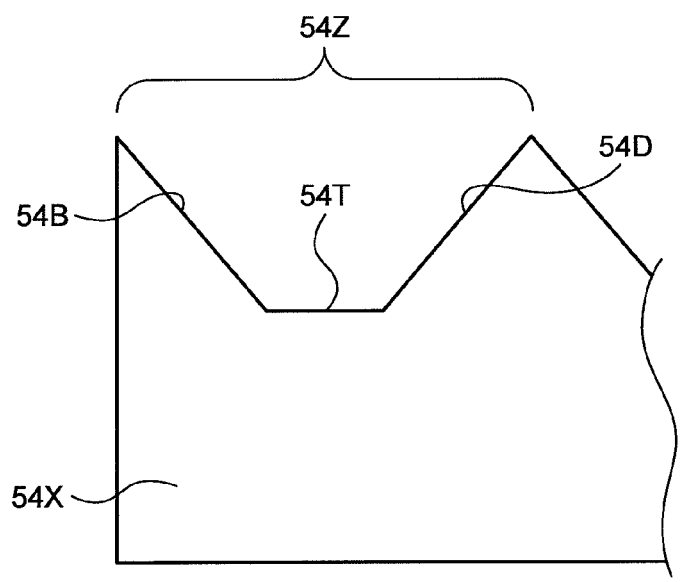
FIG. 15 is a partial cross-sectional view schematically illustrating a modified example of the concavo-convex structure unit 14Z of the reflective portion composite substrate 140 having the concavo-convex structure portion 141 in the first embodiment.

FIGS. 13, 14, and 15 are each a partial cross-sectional view schematically illustrating a modified example of the concavo-convex structure unit 14Z of the reflective portion composite substrate 140 having the concavo-convex structure portion 141 of the first embodiment. In each of FIGS. 13, 14, and 15, a cross-section of the reflective portion composite substrate 34X, 44X, or 54X is a partial cross-sectional view illustrating a cross-section of one concavo-convex structure unit, similar to the cross-section of the reflective portion composite substrate 140 illustrated in FIG. 3.

In FIG. 13, a concavo-convex structure unit 34Z of the reflective portion composite substrate 34X has a shape formed by combining a square quadrangular pyramid that has four oblique faces including oblique faces 34F and 34H and an apex 34T with a shape of a square quadrangular prismoid that has four oblique faces including oblique faces 34B and 34D from which the plateau portion has been removed. With such a shape, the angle between the oblique face 34F or 34H and the horizontal plane, i.e. the greatest angle among those for all the oblique faces, is employed as the inclination angle θ×1 of the concavo-convex structure. Further, the mean inclination angle θ×2 is determined based on the aforementioned formula (5).

In FIG. 14, a concavo-convex structure unit 44Z of the reflective portion composite substrate 44X is formed of a curved face including an oblique face 44B. With such a shape, the greatest angle among all the angles formed between the horizontal plane and the curved face, i.e. the angle θ44 between a horizontal plane and a tangent 44Q at a portion 44P where the angle of the oblique face 44B is at its greatest, is employed as the inclination angle θ×1 of the concavo-convex structure. Further, the mean inclination angle θ×2 is determined based on the aforementioned formula (5).

In FIG. 15, a concavo-convex structure unit 54Z of the reflective portion composite substrate 54X has a prismoid shape formed by combining a shape of a square quadrangular prismoid from which the apex portion has been removed that has four oblique faces including oblique faces 54B and 54D with a surface 54T of a horizontal square. With such a shape, the angle between the oblique face 54B or 54D and the horizontal plane, i.e. the greatest angle among those for all the oblique faces, is employed as the inclination angle θ×1 of the concavo-convex structure.

Further, the mean inclination angle θ×2 is determined based on the aforementioned formula (5).

Figure 16:
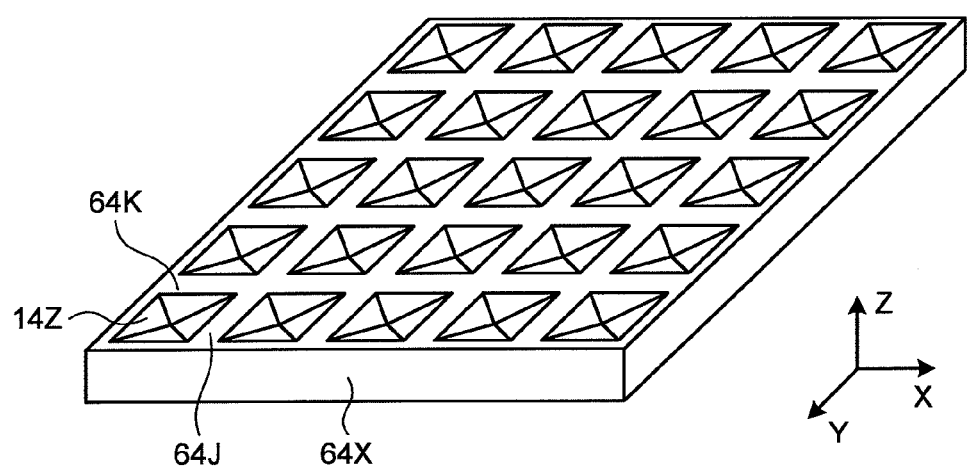
FIG. 16 is a perspective view schematically illustrating another modified example of the reflective portion composite substrate 140 having the concavo-convex structure portion 141 in the first embodiment.
Figure 17:
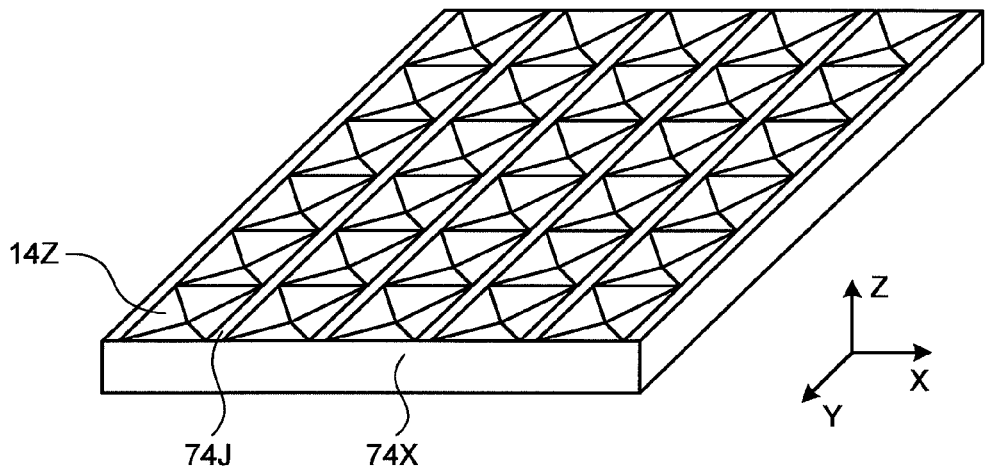
FIG. 17 is a perspective view schematically illustrating another modified example of the reflective portion composite substrate 140 having the concavo-convex structure portion 141 in the first embodiment.

FIGS. 16 and 17 are each a perspective view schematically illustrating another modified example of the reflective portion composite substrate 140 having the concavo-convex structure portion 141 of the first embodiment. In FIG. 16, the concavo-convex structure of the reflective portion composite substrate 64X has the same concavo-convex structure units 14Z as those of the first embodiment. In the reflective portion composite substrate 140, the concavo-convex structure units 14Z are arranged without gaps in the X and Y axis directions. However, in the reflective portion composite substrate 64X, gaps 64J and 64K are provided between the concavo-convex structure units 14Z in both the X and Y axis directions, respectively.

With such a shape, the inclination angle θ×1 of the concavo-convex structure is the same as that of the reflective portion composite 140. Further, the mean inclination angle θ×2 is determined based on the aforementioned formula (5). In addition, the mean inclination angle is determined excluding the flat portions.

In FIG. 17, the concavo-convex structure of the reflective portion composite substrate 74X has the same concavo-convex structure units 14Z as those of the first embodiment. In the reflective portion composite substrate 74X, the concavo-convex structure units 14Z are arranged continuously without gaps in the Y axis direction. However, in the X axis direction, the concavo-convex structure units 14Z are not arranged continuously, and a gap 74J is provided. With such a shape, the inclination angle θ×1 of the concavo-convex structure is the same as that of the reflective portion composite 140. Further, the mean inclination angle θ×2 is determined based on the aforementioned formula (5).

Further modified examples of the reflective portion composite substrate may include those having structures obtained by effecting modification on the structures other than the depression-shaped concavo-convex structure units 14Z illustrated in FIG. 2, wherein the modification is to inverse the units 14Z to obtain the protrusion-shaped concavo-convex structure units 24Z illustrated in FIG. 11. For example, such examples may include those having structures obtained by inversion of the depression-shaped concavo-convex structure units 34Z, 44Z, 54Z, 64Z, and 74Z in the reflective portion composite substrates 34X, 44X, 54X, 64X, and 74X illustrated in FIGS. 12 to 17, to form protrusion-shaped concavo-convex structure units.

In addition, when the shape of the reflective surface is defined by a member that is above the reflective layer (transparent concavo-convex layer, concavo-convex structure member directly provided on a lower side of the sealing substrate etc.) as described in the second, third, sixth, and seventh embodiments illustrated in FIGS. 4, 5, 8, and 9, the member may have the same structures as the aforementioned structures of the reflective portion composite substrates. For example, in the second embodiment illustrated in FIG. 4, a structure having the same concavo-convex structure as the reflective portion composite substrate 140 illustrated in FIG. 2 may be employed as the transparent concavo-convex layer 440. In this case, the concavo-convex structure of the reflective surface has the inversed structure of that of the first embodiment (this is because in the first embodiment the reflective portion composite substrate 140 is on the lower side of the reflective surface, whereas in the second embodiment the transparent concavo-convex layer 440 is on the upper side).

In the examples illustrated as the reflective portion composite substrates 64X and 74X illustrated in FIGS. 16 and 17, the concavo-convex structure on the surface of the member that defines the concavo-convex structure of the reflective surface, such as the reflective portion composite substrate or the transparent concavo-convex layer, has depression-shaped concavo-convex structure units provided apart from each other and flat gap portions between the concavo-convex structure units. These examples are preferred from the perspective of increasing the mechanical strength of the light source device during production and use. By providing such a structure, it is possible to provide a reflective surface concavo-convex structure capable of achieving effective prevention of deterioration of the concavo-convex structure due to abrasion during production and use, and also achieving a good light extraction efficiency.

Although the height of the concavo-convex structure of the reflective surface of the reflective layer is not particularly limited, it is particularly preferred that this height is 0.3 to 100 μm as the difference between the highest portion and the lowest portion (for example, in the example illustrated in FIG. 3, the height indicated by arrow 14H).

(Use)

Use of the organic EL light source device of the present invention is not particularly limited, although the device may be used as a light source for a backlight for a liquid crystal display device, an illumination device and the like that utilize advantageous effects of the invention, such as a high light extraction efficiency.

The light source device of the present invention is not limited to the embodiments specifically described above, and the light source devices falling within the scope of the patent claims and equivalents thereof are encompassed by the present invention. For example, the light source device of the present invention includes the first transparent electrode layer, light-emitting layer, second transparent electrode layer, structural layer X, and reflective layer as essential components. However, the light source device of the present invention may also include an optional layer as an optional component other than the aforementioned diffusion plate, sealing layer, reflective portion composite substrate and the like. The optional layer may be between those layers, at a position closer to the light-emitting surface than the first transparent electrode layer, or at a position further away from the light-emitting surface than the reflective layer (opposite side to the light-emitting surface). Further, in addition to the substrate and sealing substrate and a layer such as a sealing layer above and below the light-emitting element that were mentioned as examples of the structure for sealing the light-emitting element, the light source device of the present invention may also include a sealing member for sealing the peripheral region of the light-emitting element. In addition, the light source device may also include other optional components required for forming the light source device, such as electricity distribution means for supplying the electrodes with electricity.

EXAMPLES

The present invention will now be described in more detail based on the examples. However, the present invention is not limited to the following examples.

Preparatory Example 1

Preparation of Adhesive for Sealing Layer 300 parts by weight of polyisoprene was completely dissolved in 700 parts by weight of toluene, and 2.4 parts by weight of p-toluenesulfonic acid was added thereto, for carrying out a cyclization reaction to obtain a solution of a polymer cyclized product.

2.5 parts by weight of maleic anhydride was added to 100 parts by weight of the obtained polymer cyclized product in the solution for carrying out an addition reaction.

A part of the toluene in the solution was removed by distillation, and an antioxidant was added thereto. Then vacuum drying was carried out for removing the toluene and unreacted maleic anhydride, to obtain a modified conjugated diene polymer cyclized product type adhesive.

Example 1

An organic EL light source device having the configuration of the first embodiment illustrated in FIG. 1 was produced.

(1-1: Preparation of Light-Emitting Element)

On a surface of a 0.7 mm-thick glass substrate 101, an organic EL light-emitting element that included the first transparent electrode layer 111, the organic light-emitting layer 121, and the second transparent electrode layer 112 was provided.

(1-2: Preparation of Stacked Body in which Light-Emitting Element is Sealed)

A surface of a 0.7 mm-thick glass sealing substrate 102 was coated with the adhesive for a sealing layer obtained in Preparatory Example 1. This coated surface was attached to the surface on the second transparent electrode layer side of the light-emitting element obtained in (1-1). Electricity distribution means to the electrode layer was provided on the peripheral region of the element, and the element was then sealed with a periphery sealing member (not illustrated in FIG. 1) to form a 15 μm-thick sealing layer 131. As a result, a stacked body having the substrate 101, the first transparent electrode layer 111, the organic light-emitting layer 121, the second transparent electrode layer 112, the sealing layer 131, and the sealing substrate 102 was obtained.

(1-3: Reflective Portion Composite Substrate)

A surface of a substrate film formed of a resin having an alicyclic structure (Trade name: "ZEONOR Film", manufactured by ZEON CORPORATION) was coated with a UV-ray curable resin (acrylate resin, refractive index n=1.53) to form a coating layer. A metal mold having a predetermined shape was pressed against the coating layer, and UV-ray irradiation was performed at a cumulative light amount of 1,000 mJ/cm$^2$ from the substrate film side to cure the coating layer, to form a concavo-convex structure portion on the substrate film. Then, the mold was peeled off the concavo-convex structure portion, to obtain a reflective portion composite substrate 140 composed of the substrate film and the concavo-convex structure portion.

The concavo-convex structure on the surface of the concavo-convex structure portion of the obtained reflective portion composite substrate 140 was composed of the plurality of quadrangular pyramid shaped depressions 14Z schematically illustrated in FIG. 2. The angle between the oblique faces 14A to 14D constituting the depressions 14Z and the surface of the substrate film was 30°. The length of the bottom edge 14E of the depressions 14Z was 20 μm. The depressions 14Z were aligned with a pitch of 20 μm in two directions orthogonal to each other on the plane of the concavo-convex structure portion. The total thickness of the reflective portion composite substrate 140 was 200 μm.

(1-4: Reflective Layer having Concavo-Convex Structure)

On the surface on which the ridges were formed of the reflective portion composite substrate 140 obtained in (1-3), vapor deposition of silver was performed to a thickness of 200 nm, to form a metal reflective layer, whereby a reflective portion composite body 144 composed of the reflective portion composite substrate 140 and the reflective layer 142 having the concavo-convex structure was obtained.

(1-5: Production of Light Source Device)

The surface on the reflective layer 142 side of the reflective portion composite body 144 obtained in (1-4) was coated with the sealing adhesive obtained in Preparatory Example 1, and this coated surface was attached to the sealing substrate 102 side of the stacked body obtained in (1-2), to form an adhesion layer 132 having a thickness (distance from the highest portion of the reflective surface concavo-convex structure to the sealing substrate 102) of 18 µm. As a result, an organic EL light source device having the substrate 101, the first transparent electrode layer 111, the organic light-emitting layer 121, the second transparent electrode layer 112, the sealing layer 131, the sealing substrate 102, the adhesion layer 132, the reflective layer 142, and the reflective portion composite substrate 140 was obtained. The refractive indices of the sealing layer 131 and the adhesion layer 132 were both 1.5.

In the present example, since the adhesion layer 132 serves as the structural layer X, in expressions (1) to (4) n is 1.5. That is, according to expression (1) $\theta \times 1 \leq 41.8$, according to expression (2) $16.1 \leq \theta \times 2 \leq 41.8$, according to expression (3) $24.1 \leq \theta \times 2 \leq 42.8$, and according to expression (4) $28.0 \leq \theta \times 2 \leq 38.0$. Further, in the present example, $\theta \times 1$ and $\theta \times 2$ are both 30°. Consequently, the present example satisfies these expressions (1) to (4).

(1-6: Evaluation)

Light was emitted by applying a constant current to the obtained organic EL light source device. Luminosity was measured using an EZ-contrast manufactured by ELDIM to determine the total light amount.

Comparative Example 1

An organic EL light source device was produced in the same manner as in Example 1, except for changing the mold in step (1-3). In the obtained organic EL light source device, the concavo-convex structure on the surface of the concavo-convex structure portion of the reflective portion composite substrate 140 was composed of the plurality of quadrangular pyramid shaped depressions 14Z schematically illustrated in FIG. 2. The angle between the oblique faces 14A to 14D forming the depressions 14Z and the surface of the substrate film was 60°. The length of the bottom edge 14E of the depressions 14Z was 20 µm. The depressions 14Z were aligned with a pitch of 20 µm in two directions orthogonal to each other on the surface of the concavo-convex structure portion. The total thickness of the reflective portion composite substrate 140 was 200 µm.

In the present comparative example, the adhesion layer 132 serves as the structural layer X, so that in expressions (1) to (4) n is 1.5. That is, according to expression (1) $\theta \times 1 \leq 41.8$, according to expression (2) $16.1 \leq \theta \times 2 \leq 41.8$, according to expression (3) $24.1 \leq \theta \times 2 \leq 41.8$, and according to expression (4) $28.0 \leq \theta \times 2 \leq 38.0$. Further, in the present example, $\theta \times 1$ and $\theta \times 2$ are both 60°. Consequently, the present comparative example does not satisfy the expressions (1) to (4).

Light was emitted by applying a constant current to the obtained organic EL light source device. Luminosity was measured using an EZ-contrast manufactured by ELDIM to determine the total light amount. It was thus found out that Example 1 had an 11% larger total light amount than Comparative Example 1.

Example 2

The relationship between the mean inclination angle) (°) of the oblique faces in a quadrangular pyramid and the light extraction efficiency (%) from a light-emitting surface 100A was studied based on a simulation using a program (Program name: Light Tools, Optical Research Associates) in the following case. In the organic EL light source device illustrated in FIG. 1, the refractive indices of the light-emitting layer 121 and second transparent electrode layer (ITO) were set to 1.8, the refractive indices of the sealing layer 131 and adhesion layer 132 were set to 1.53, the refractive indices of the substrate 101 and sealing substrate 102 were set to 1.53, the reflectance of the reflective surface of the reflective layer 142 was set to 100%, and the optical density of the light-emitting element 120 is set to a value with which the light that passes through the light-emitting element 120 from the front direction is absorbed with the absorbance ratio of 10%. The shape of the concavo-convex structure units of the reflective surface is set to the quadrangular pyramid shape illustrated in FIG. 2. The orientation characteristic (initial orientation characteristic) of the light emitted from the light-emitting element 120 toward the substrate 101 and the sealing layer 131 is set as described below. The results of study are shown in Table 18.

Initial orientation characteristic: Luminosity $(\theta)=1$

Here, $\theta$ is the angle (°) between the normal direction of the main plane of the light-emitting layer and the observing direction, and luminosity $(\theta)$ represents the luminosity when observed from this angle.

In the present example, since the adhesion layer serves as the structural layer X, in expressions (1) to (4) n is 1.53. That is, according to expression (1) $\theta \times \leq 40.8$, according to expression (2) $16.4 \leq \theta \times 2 \leq 40.8$, according to expression (3) $24.6 \leq \theta \times 2 \leq 40.8$, and according to expression (4) $27.7 \leq \theta \times 2 \leq 37.7$. Further, in the present example, both $\theta \times 1$ and $\theta \times 2$ match the mean inclination angle.

Figure 18:
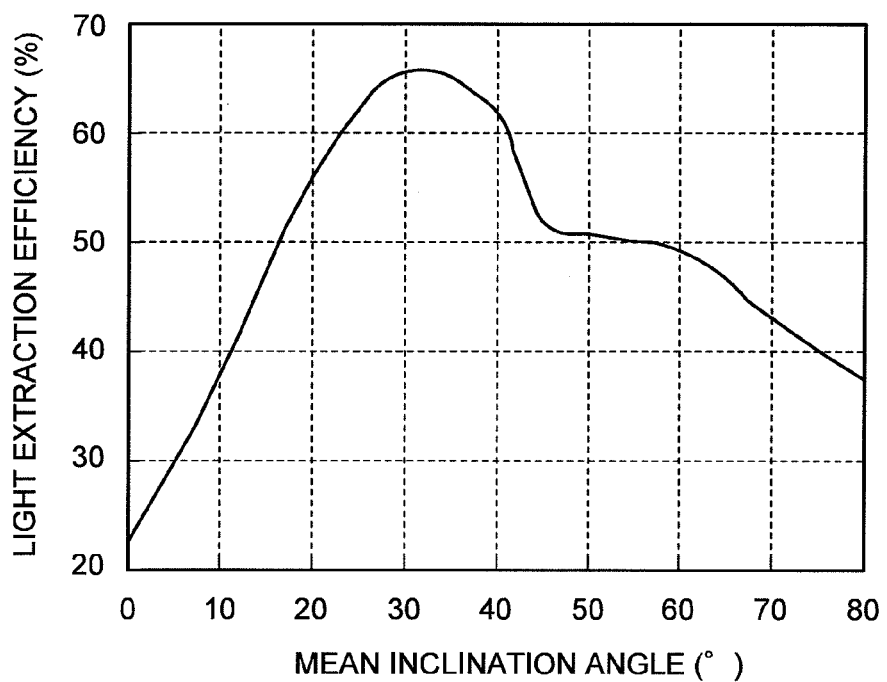
FIG. 18 is a graph illustrating a result of study in Example 2.

From the results in FIG. 18, it can be seen that when the mean inclination angle is varied, a preferred extraction efficiency can be obtained when expressions (1) and (2) are satisfied, a more preferred extraction efficiency can be obtained when expression (3) is satisfied, and an even more preferred extraction efficiency can be obtained when expression (4) is satisfied.

Reference Example 1

Figure 19:
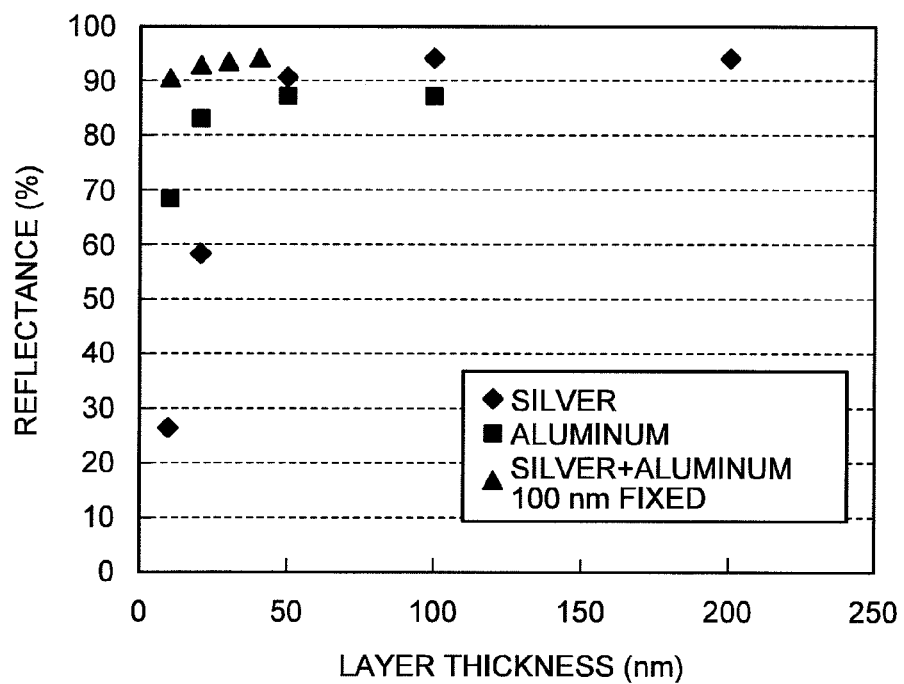
FIG. 19 is a graph illustrating a result of study in Reference Example 1.

The reflectance of a reflective surface when a metal layer was employed for the reflective layer was calculated. For the calculation, the refractive index of aluminum was set as 1.29, the complex refractive index of aluminum was set as 7.23, the refractive index of silver was set as 0.13, and the complex refractive index of silver was set as 3.34. Studies were performed as to three instances that are: (i) an instance in which silver was used as the reflective layer, (ii) an instance in which aluminum was used as the reflective layer, and (iii) an instance in which aluminum and silver were used as the reflective layer, with the layer configured so that the silver served as the reflective surface. In each of (i) and (ii), the layer thickness of the reflective layer for both of (i) and (ii) was varied. In (iii), the aluminum layer thickness in (iii) was set to 100 nm and the silver layer thickness was varied. FIG. 19 shows the results of study of the relationship between layer thickness and reflectance.

From the results in FIG. 19, it can be seen that in the instance (ii), reflectance reached saturation at under 90%, and it was unable to obtain a reflectance as high as that in the instance (i) even when the layer thickness was increased. On the other hand, in the instance (iii), it was possible to obtain a high reflectance comparable to that of the thick silver reflective layer of (i) at a silver thickness of about 50 nm. Based on these results, it can be seen that in the instance (iii) a reflective layer having a low total cost and a high reflectance can be obtained using a layer formed of low-cost aluminum and a small amount of high-cost silver.

Reference Example 2

Based on the results of study of Reference Example 1, (i) a 100 nm silver reflective layer, (ii) a 100 nm aluminum reflective layer, and (iii) a combination of 100 nm aluminum and 20 nm silver in which silver is served as the reflective surface, were produced and the reflectance of each reflective layer was measured. The results were 98.8% for (i), 88.3% for (ii), and 94.2% for (iii).

REFERENCE SIGNS LIST

100, 400, 500, 600, 700, 800, 900 Organic EL Light Source Device
101, 601 Substrate
102, 602 Sealing Substrate
111, 611 First Transparent Electrode Layer
112, 612 Second Transparent Electrode Layer
120, 620 Light-emitting Element
121, 621 Light-emitting Layer
131, 631, 933 Sealing Layer
132, 432 Adhesion Layer
140, 24X, 34X, 44X, 54X, 64X, 74X Reflective Portion Composite Substrate
141, 441, 541, 841 Concavo-convex Structure Portion
142, 442, 542, 842 Reflective Layer
144 Reflective Portion Composite Body
14A-14D, 24A-24D, 34B, 34D, 34F, 34H, 44B, 54B, 54D Oblique Face
14E, 24E Bottom Edge
14T, 24T, 34T Apex
14Z, 24Z, 34Z, 44Z, 54Z Concavo-convex Structure Unit
440, 840 Transparent Concavo-convex Layer
54T Flat Surface
64J, 64K, 74J Gap
732, 832 Sealing Adhesion Layer
943 Sealing Metal Layer
944 Substrate

The invention claimed is:

1. An organic electroluminescent light source device comprising a first transparent electrode layer, a light-emitting layer, a second transparent electrode layer, and a reflective layer having a reflective surface, in this order from a light-emitting surface side, and further comprising a structural layer X that is provided between the second transparent electrode layer and the reflective surface and is in contact with the reflective surface, wherein the reflective surface has a concavo-convex structure, the concavo-convex structure has a plurality of concavo-convex structure units formed of depressions or protrusions, and a refractive index n of the structural layer X, an inclination angle θ×1 (°) of the concavo-convex structure units, and a mean inclination angle θ×2 (°) of the concavo-convex structure at the reflective surface satisfy the following expressions (1) and (2):

$$\theta \times 1 \leq \sin^{-1}(1/n) \quad (1)$$

$$\{90-\sin^{-1}(1/n)\}/3 \leq \theta \times 2 \leq \sin^{-1}(1/n) \quad (2).$$

2. The organic electroluminescent light source device according to claim 1, wherein the refractive index n of the structural layer X and the mean inclination angle θ×2 (°) of the concavo-convex structure at the reflective surface satisfy the following expression (3):

$$\{90-\sin^{-1}(1/n)\}/2 \leq \theta \times 2 \leq \sin^{-1}(1/n) \quad (3).$$

3. The organic electroluminescent light source device according to claim 1, wherein the refractive index n of the structural layer X and the mean inclination angle θ×2 (°) of the concavo-convex structure at the reflective surface satisfy the following expression (4):

$$(\{90+\sin^{-1}(1/n)\}/4)-5 \leq \theta \times 2 \leq (\{90+\sin^{-1}(1/n)\}/4)+5 \quad (4).$$

4. The organic electroluminescent light source device according to claim 1, wherein the concavo-convex structure units of the reflective surface have a pyramid or prismoid shape.

5. The organic electroluminescent light source device according to claim 1, wherein the concavo-convex structure has depressions provided apart from each other as concavo-convex structure units and flat gap portions between adjacent depressions.

6. The organic electroluminescent light source device according to claim 1, wherein the reflective layer is a stacked body of a first metal layer including a first metal and a second metal layer including a second metal which is different from the first metal.

7. The organic electroluminescent light source device according to claim 1, further comprising a light diffusion layer provided on a light-emitting surface side of the reflective layer.

* * * * *